United States Patent [19]
Fukuda et al.

[11] Patent Number: 5,412,604
[45] Date of Patent: May 2, 1995

[54] SEMICONDUCTOR DEVICE USING BOOSTED SIGNAL

[75] Inventors: Tatsuya Fukuda; Takeshi Kajimoto, both of Hyogo, Japan

[73] Assignee: Mitsubishi Denki Kabushiki kaisha, Tokyo, Japan

[21] Appl. No.: 249,607

[22] Filed: May 26, 1994

[30] Foreign Application Priority Data

May 31, 1993 [JP] Japan .................................. 5-129214
Mar. 25, 1994 [JP] Japan .................................. 6-055350

[51] Int. Cl.⁶ .................................................. G11C 7/00
[52] U.S. Cl. .............................. 365/189.11; 365/194; 365/230.03
[58] Field of Search .............. 365/189.11, 194, 230.03, 365/222, 193

[56] References Cited

U.S. PATENT DOCUMENTS

| | | | |
|---|---|---|---|
| 4,533,843 | 8/1985 | McAlexander, III et al. | 307/530 |
| 5,016,224 | 5/1991 | Tanaka et al. | 365/230.03 |
| 5,021,998 | 6/1991 | Suzuki et al. | 365/230.03 X |
| 5,056,062 | 10/1991 | Kuwabara et al. | 365/189.11 |
| 5,058,063 | 10/1993 | Wada et al. | 365/189.11 X |

FOREIGN PATENT DOCUMENTS

3-241589 10/1991 Japan .

OTHER PUBLICATIONS

A 35ns 64 Mb Dram Using On-Chip Boosted Power Supply, Dong–Jae Lee et al., 1992 Symposium on VLSI Circuits Digest of Technical Papers, 1992 IEEE.
Variable VCC Design Techniques For Battery Operated Drams, Seung–Moon Yoo et al., 1992 Symposium on VLSI Circuits Digest of Technical Papers.

Primary Examiner—Joseph A. Popek
Assistant Examiner—Son Dinh
Attorney, Agent, or Firm—Lowe, Price, LeBlanc & Becker

[57] ABSTRACT

A level converting unit outputs a signal at a ground potential GND or at a boosted power supply voltage $V_{PP}$ level in response to a control signal. In response to a control signal BLIM, a first level selecting unit outputs a signal at the ground potential GND or at a power supply voltage $V_{CC}$ level. A second level selecting unit outputs a predetermined signal from a signal at the boosted voltage $V_{PP}$ level of the level converting unit, a signal at the ground potential GND of the first level selecting unit, and a signal at the power supply voltage $V_{CC}$ level as a shared sense amplifier control signal in response to each above-described control signal. As a result, when the shared sense amplifier control signal is pulled up to the boosted voltage $V_{PP}$ level, it is possible to pull up the shared sense amplifier control signal to the power supply voltage $V_{CC}$ level, and then to the boosted voltage $V_{PP}$ level.

16 Claims, 15 Drawing Sheets

SEMICONDUCTOR DEVICE USING BOOSTED SIGNAL

BACKGROUND OF THE INVENTION

1. Field of the Invention

The present invention relates to semiconductor devices, and more particularly, to a semiconductor device using a signal boosted to a predetermined voltage level.

2. Description of the Background Art

Some semiconductor devices use a signal boosted to a predetermined voltage level rather than a signal of an ordinary power supply voltage level, in order to obtain stability of operation of an internal circuit or the like. Some DRAMs (Dynamic Random Access Memories) have a shared sense amplifier configuration in which a sense amplifier is shared by two separate memory blocks. In the DRAM having the shared sense amplifier configuration, the above-described boosted signal is used as a control signal controlling selective connection of the sense amplifier to one of the two memory blocks.

The DRAM will be described with reference to the drawings as a conventional semiconductor device. FIG. 9 is a block diagram showing a configuration of a conventional DRAM.

In FIG. 9, a DRAM 200 includes memory cell arrays 1a to 1d, sense amplifier units 2a, 2b, a row decoder 3, a word driver 4, a row address buffer 5, an RAS buffer 6, a φx generating circuit 7, a φx subdecoder 12, a row predecoder 15, a column address buffer 16, a column predecoder 17, a column decoder 18, an I/O decoder 19, an R/W control unit 20, a CAS buffer 21, an R/W buffer 22, an input buffer 23, an output buffer 24, and a sense amplifier control circuit 25.

DRAM 200 includes terminals P1 to P6 for input/output a signal from/to outside. To terminal P1, input is a row address strobe signal /RAS ("/" indicates an inverted signal) which provides a timing at which row addresses provided in a time sharing manner are incorporated into the device. To terminal P2, input are row addresses RA0 to RA8 and column addresses CA0 to CA8 provided in a timing sharing manner. To terminal P3, input is a column address strobe signal /CAS which provides a timing at which the column addresses are incorporated into the device. To terminal P4, input is a read/write control signal R/W defining the read/write operation. To terminal P5, input is input data $D_{IN}$. Output data $D_{OUT}$ is output from terminal P6. DRAM 200 further includes a terminal supplying power supply voltage $V_{CC}$ serving as a reference voltage and a terminal supplying ground potential GND (not shown).

Row address buffer 5 receives 9-bit address signals A0 to A8 provided to terminal P2, and generates complementary internal row address signals RA0, /RA0, ..., RA8, /RA8 in response to an internal control signal from RAS buffer 6.

Row predecoder 15 decodes internal row address signals RA2, /RA2, ..., RA7, /RA7 from row address buffer 5, and generates 12 predecode signals in total of X1 to X4 (generally referred to as "Xi"), X5 to X8 (generally referred to as "Xj"), and X9 to X12 (generally referred to as "Xk").

φx generating circuit 7 generates a word line drive master signal φx for driving a word line in response to an internal control signal from RAS buffer 6 to output the same to φx subdecoder 12.

φx subdecoder 12 generates word line subdecode signals φx1 to φx4 in response to internal row address signals RA0, /RA0, RA1 and /RA1 from row address buffer 5, and word line drive master signal φx, to output the same to word driver 4.

Row decoder 3 further decodes predecode signals Xi, Xj and Xk output from row predecoder 15, and generates a decode signal selecting four word lines.

Word driver 4 outputs a word line drive signal WL onto one word line in response to the decode signal from row decoder 3 and word line subdecode signals φx1 to φx4 from φx subdecoder 12.

Column address buffer 16 incorporates the address input to terminal P2 in response to the column address strobe signal /CAS from CAS buffer 21, and outputs an internal column address signal to column predecoder 17.

Column predecoder 17 outputs complementary internal column address signals to column decoder 18 in response to the internal column address signal.

Column decoder 18 outputs a column select signal CS selecting four columns in response to a column predecode signal.

Sense amplifier control circuit 25 includes an SF signal generating circuit 9, a first sense amplifier activating circuit 10, and a second sense amplifier activating circuit 11.

SF signal generating circuit 9 provides a signal activating a sense amplifier of either sense amplifier unit 2a or 2b to sense amplifier units 2a, 2b in response to the word line drive master signal φx from φx generating circuit 7 and the predecode signal Xi from row predecoder 15.

First sense amplifier activating circuit 10 provides a first sense amplifier activation signal to sense amplifier units 2a, 2b in response to a control signal from SF signal generating circuit 9.

Second sense amplifier activating circuit 11 provides a second sense amplifier activation signal to sense amplifier units 2a, 2b in response to the activation signal from first sense amplifier activating circuit 10.

A block select signal generating circuit 26 provides block select signals BS0 to BS3 to a shared sense control unit 27 in response to the internal row address signals RA0, RA1 from row address buffer 5 and the row address strobe signal /RAS input through RAS buffer 6.

Shared sense control unit 27 provides shared sense control signals BLIS0 to BLIS3, BLIK0 to BLIK3 to a BLI driver unit 28 in response to the block select signals BS0 to BS3 from block select signal generating circuit 26.

BLI driver unit 28 provides to sense amplifier units 2a, 2b shared sense amplifier control signals BLI0, BLI1, BLI2, BLI3 controlling a connection of a sense amplifier (not shown) included in sense amplifier units 2a, 2b and bit lines BL, /BL of memory cell arrays 1a to 1d in response to the control signals BLIS0 to BLIS3, BLIK0 to BLIK3 from shared sense control unit 27.

I/O decoder 19 decodes an internal row address signal from row address buffer 16 and an internal column address signal from column address buffer 5, and selects a pair of signal lines out of an I/O bus.

R/W buffer 22 generates a timing signal defining write/read of data in response to the read/write control signal R/W provided through terminal P4 and the column address strobe signal /CAS from CAS buffer 21, and outputs the signal to R/W control unit 20.

R/W control unit 20 connects a pair of signal lines selected by I/O decoder 19 to input buffer 23 or output buffer 24 in response to a control signal from R/W buffer 22.

Input buffer 23 receives input data $D_{IN}$ applied through terminal P5, and generates corresponding internal data.

Output buffer 24 receives the internal data output from R/W control unit 20 and converts the same into corresponding output data $D_{OUT}$ and outputs the converted data to terminal P6.

Because of the above-described configuration, corresponding to the row address and the column address applied to terminal P2, it is possible to write input data $D_{IN}$ applied from terminal P5 to a predetermined memory cell in memory cell arrays 1a to 1d and to read out the written data to output the same as output data $D_{OUT}$ from terminal P6.

Description will now be given in detail of BLI driver unit 28 with reference to the drawings. FIG. 10 is a block diagram showing a configuration of BLI driver unit 28 and sense amplifier units 2a, 2b.

In FIG. 10, BLI driver unit 28 includes BLI drivers 281 to 284. BLI driver 281 provides the shared sense amplifier control signal BLI0 to sense amplifier unit 2a in response to control signals BLIS0, BLIK0 from block select signal generating circuit 26. BLI drivers 282 to 284 operate similarly. BLI driver unit 28 includes a boosted voltage generating unit (not shown) which boosts the power supply voltage $V_{CC}$ to a predetermined boosted voltage $V_{PP}$ by using the charge pump operation of a capacitor to supply the voltage to BLI drivers 281 to 284.

Sense amplifier unit 2a includes a sense amplifier 21 and transistors Q21 to Q24. Transistors Q21 to Q24 are n-channel transistors. The gates of transistors Q21, Q22 are connected to BLI driver 281, and supplied with the shared sense amplifier control signal BLI0. The gates of transistors Q23, Q24 are connected to BLI driver 282, and supplied with the shared sense amplifier control signal BLI1. Bit line BL0 and bit line /BL0 of memory cell array 1a are respectively connected to terminals P21 and P22. Bit line BL1 and bit line /BL1 of memory cell array 1b are respectively connected to terminals P23 and P24. Since the configuration of sense amplifier unit 2b is the same as that of sense amplifier unit 2a, the description will not be repeated.

Description will first be given of operation at the time of stand-by. At stand-by, the control signals BLIS0 to BLIS3 are all at the power supply voltage $V_{CC}$ ("H") level, and the control signals BLIK0 to BLIK3 are all at the ground potential GND ("L") level. At this time, BLI drivers 281 to 284 are provided at the boosted voltage $V_{PP}$ level ("H") boosted from the power supply voltage $V_{CC}$ as the shared sense amplifier control signals BLI0, BLI1, BLI2, BLI3.

Description will now be given of operation in an active period. When terminals P21, P22 are selected, for example, the control signal BLIS0 attains an "H" level, and the control signal BLIK0 attains an "L" level. The control signals BLIS1 to BLIS3 attain an "L" level, and the control signals BLIK1 to BLIK3 attain an "H" level. In this case, the shared sense amplifier control signal BLI0 is provided at the boosted voltage $V_{PP}$ level (selected state), and the other shared sense amplifier control signals all attain an "L" level (non-selected state). When the shared sense amplifier control signal BLI0 attains an "H" level, transistors Q21, Q22 are turned on, and connects sense amplifier 21 and the side of terminals P21, P22. On the other hand, since the shared sense amplifier control signals BLI1 to BLI3 at an "L" level (the ground potential GND) are input to transistors Q23 to Q28, transistors Q23 to Q28 are all turned off, and disconnects sense amplifiers 21, 22 and each terminal side.

As a selected state of the shared sense amplifier control signal, the value of the boosted voltage $V_{PP}$ is set to a value higher than the voltage level obtained by the power supply voltage $V_{CC}$ plus the threshold voltage $V_{th}$ of transistors Q21 to Q28. This is because of the following reason. When the device is operated with unstable power supply voltage $V_{CC}$, the bit line potential sometimes becomes higher than the potential of the shared sense amplifier control signal. As a result, transistors Q21 to Q28 are rendered non-conductive, and there is a possibility that a read signal of the memory cell might not be transmitted to the input node of the sense amplifier.

As described above, by using a signal at the boosted voltage $V_{PP}$ level as the selected state of the shared sense amplifier control signal, it is possible to sufficiently transmit to a bit line pair a signal at the power supply voltage $V_{CC}$ level amplified by sense amplifier 21 or 22, making it possible to enhance reliability of the device.

A detailed description will be given of the BLI driver with reference to the drawings. FIG. 11 is a circuit diagram showing the configuration of BLI driver 281.

BLI driver 281 includes a level converting unit 285, and a level selecting unit 286. Level converting unit 285 includes transistors Q281 to Q284. Level selecting unit 286 includes transistors Q285, Q286. It should be noted that transistors Q281, Q283, Q285 are p-channel MOS transistors, and that transistors Q282, Q284, Q286 are n-channel MOS transistors.

Transistor Q281 is connected to the boosted voltage $V_{PP}$ and transistor Q282, with its gate connected to a connection portion of transistor Q283 and transistor Q284. Transistor Q282 is connected to the ground potential GND, and supplied with the control signal BLIK0 at its gate. Transistor Q283 is connected to the boosted voltage $V_{PP}$, with its gate connected to a connection portion of transistor Q281 and transistor Q282. Transistor Q284 is connected to the ground potential GND, and supplied with the control signal BLIS0 at its gate.

Description will now be given of operation of level converting unit 285. When the control signal BLIS0 is at an "H" (the power supply voltage $V_{CC}$) level, and the control signal BLIK0 is at an "L" (the ground potential GND) level, transistors Q281 and Q284 are turned on, and transistors Q282 and Q283 are turned off. As a result, a node 287 attains an "L" (the ground potential GND) level. When the control signal BLIS0 is at an "L" level, and the control signal BLIK0 is at an "H" (the power supply voltage $V_{CC}$) level, transistors Q281 and Q284 are turned off, and transistors Q282 and Q283 are turned on. As a result, node 287 attains an "H" (the boosted voltage $V_{PP}$) level. Therefore, if the control signal BLIK0 is input at the power supply voltage $V_{CC}$ level, node 287 attains the boosted voltage $V_{PP}$ level, making it possible to convert a signal at the power supply voltage $V_{CC}$ level into a signal at the boosted voltage $V_{PP}$ level.

Level selecting unit 286 includes transistors Q285, Q286. Transistor Q285 is connected to the boosted voltage $V_{PP}$ and transistor Q286, with its gate connected to node 287. Transistor Q286 is connected to the ground potential GND, and supplied with the control signal BLIK0 at its gate.

Description will now be given of operation of level converting unit 286. When the control signal BLIK0 is at an "L" level, and node 287 is at an "L" level, transistor Q285 is turned on, and transistor Q286 is turned off. As a result, a signal at an "H" (the boosted voltage $V_{PP}$) level is output as the shared sense amplifier control signal BLI0. When the control signal is at an "H" (the power supply voltage $V_{PP}$) level, and node 287 is at an "H" (the boosted voltage $V_{PP}$) level, transistor Q285 is turned off, and transistor Q286 is turned on. As a result, a signal at an "L" level is output as the shared sense amplifier control signal BLI0.

Because of the above-described operation, it is possible to convert the control signal BLIS0 signal at the power supply voltage $V_{CC}$ level into the shared sense amplifier control signal BLI0 at the boosted voltage $V_{PP}$ level. Although the above description is given with respect to BLI driver 281, BLI drivers 282 to 284 have the same configuration. BLI drivers 282 to 284 can implement the same operation.

Description will now be given of signal waveforms of the control signals BLIS0, BLIK0 and the shared sense amplifier control signal BLI0. FIG. 12 is a diagram showing signal waveforms of the control signals BLIS0, BLIK0, and the shared sense amplifier control signal BLI0. As shown in FIG. 12, the control signal BLIS0 and the control signal BLIK0 are complementary to each other. At the time of stand-by of the device, the control signal BLIS0 is at an "H" (the power supply voltage $V_{CC}$) level, and the control signal BLIK0 is at an "L" level. At this time, the shared sense amplifier control signal BLI0 output from BLI driver 281 is at an "H" (the boosted voltage $V_{PP}$) level. When the device enters an active state, the control signal BLIS0 falls, and the control signal BLIK0 rises. At this time, the shared sense amplifier control signal BLI0 falls and attains an "L" level, that is, a state where the sense amplifiers are not selected. When the device completes the active state and enters again the stand-by state, the control signal BLIS0 rises, and the control signal BLIK0 falls. At this time, the shared sense amplifier control signal BLI0 rises to an "H" (the boosted voltage $V_{PP}$) level, and the device enters the stand-by state.

In order to ensure stability of the operation, a boosted voltage higher than the power supply voltage is used as described above. In this case, when the voltage is converted from the power supply voltage to the boosted voltage, a loss is caused by boosting. When it is intended to obtain an abrupt rise of the voltage up to the boosted voltage $V_{PP}$ level, a larger current is to be consumed. Therefore, as described above, when the device changes its state from the active state to the stand-by state, if it is intended to obtain an abrupt rise of the shared sense amplifier control signal from the ground potential level to the boosted voltage level, it is necessary to make a larger current flow in order to compensate for a loss caused by boosting, which increases power consumption.

In such a dynamic type semiconductor memory device as described above, a signal line transmitting a shared sense amplifier control signal becomes long, and a load capacitance of the signal line becomes large. Therefore, increase in current consumption caused by the above-described boosting becomes very large, and power consumption of the entire device is substantially increased.

SUMMARY OF THE INVENTION

One object of the present invention is to provide a semiconductor device which can suppress increase in current consumption caused by boosting, and can reduce power consumption.

Another object of the present invention is to provide a semiconductor device which can always supply a control signal at a stable boosted voltage level, and can implement stable circuit operation.

A still another object of the present invention is to provide a semiconductor device which can improve high speed respondence of a control signal, and can increase the operation speed of the device.

The semiconductor device according to one aspect of the present invention carries out a predetermined operation in response to a timing at which a third control signal output in response to first and second control signals changes from a first voltage level to a boosted second voltage level. The semiconductor device includes an output circuit providing the second control signal delayed from the first control signal, and a control signal output circuit providing the third control signal rising from the first voltage level to the second voltage level, wherein the third control signal rises to a third voltage level between the first voltage level and the second voltage level in response to the first control signal, and then to the second voltage level in response to the second control signal.

Since the control signal output circuit once provides a signal at the third voltage level when it pulls up the third control voltage from the first voltage level to the second voltage level, the circuit is not affected by a loss caused by boosting until it provides the signal at the third voltage level. Therefore, the circuit can provide the third control signal efficiently.

As a result, the device can suppress increase in current consumption caused by boosting, and reduce power consumption.

The semiconductor device according to another aspect of the present invention includes first and second storage units storing information, an amplifying circuit amplifying an information signal output from the first or second storage unit, a connection circuit selectively connecting the amplifying circuit and the first or second storage unit in response to a control signal, and a control signal output circuit providing the control signal rising from a first voltage level to a boosted second voltage level, wherein the control signal rises from the first voltage level to a third voltage level between the first voltage level and the second voltage level, and then to the second voltage level from the third voltage level.

When the control signal output circuit pulls up the control signal controlling connection of the amplifying circuit and the first or second storage unit from the first voltage level to the boosted second voltage level, the control signal output circuit first pulls up the control signal from the first voltage level to the third voltage level, and then to the second voltage level from the third voltage level. Therefore, the control signal output circuit is not affected by a loss caused by boosting until the circuit provides a signal at the third voltage level. The circuit can provide the control signal efficiently.

As a result, the device can suppress increase in current consumption caused by boosting, and reduce power consumption. When a signal line transmitting the control signal is long and a load capacitance is large, it is possible to reduce power consumption, in particular.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given hereinafter of the semiconductor device according to the first embodiment of the present invention with reference to the drawings.

Figure 1:
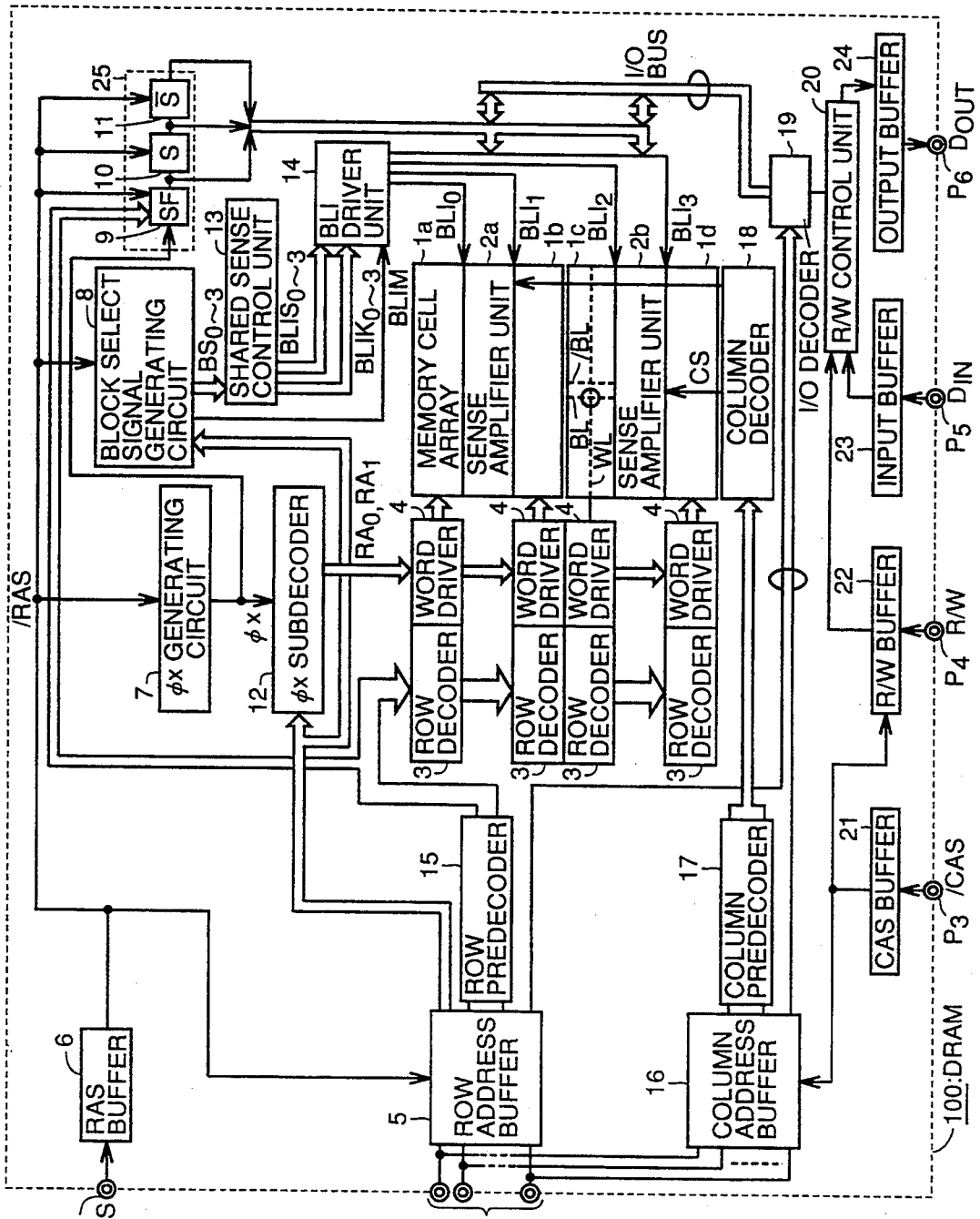
FIG. 1 is a block diagram showing a configuration of a semiconductor device according to a first embodiment of the present invention.

Referring to FIG. 1 showing the entire configuration of a DRAM (Dynamic Random Access Memory) to which the present invention is applied, a DRAM 100 includes memory cell arrays 1a to 1d, sense amplifier units 2a, 2b, a row decoder 3, a word driver 4, a row address buffer 5, an RAS buffer 6, a $\phi x$ generating circuit 7, a block select signal generating circuit 8, a $\phi x$ subdecoder 12, a shared sense control unit 13, a BLI driver unit 14, a row predecoder 15, a column address buffer 16, a column predecoder 17, a column decoder 18, an I/O decoder 19, an R/W control unit 20, a CAS buffer 21, an R/W buffer 22, an input buffer 23, an output buffer 24, and a sense amplifier control unit 25 (including an SF signal generating circuit 9, a first sense amplifier activating circuit 10, and a second sense amplifier activating circuit 11).

Figure 9:
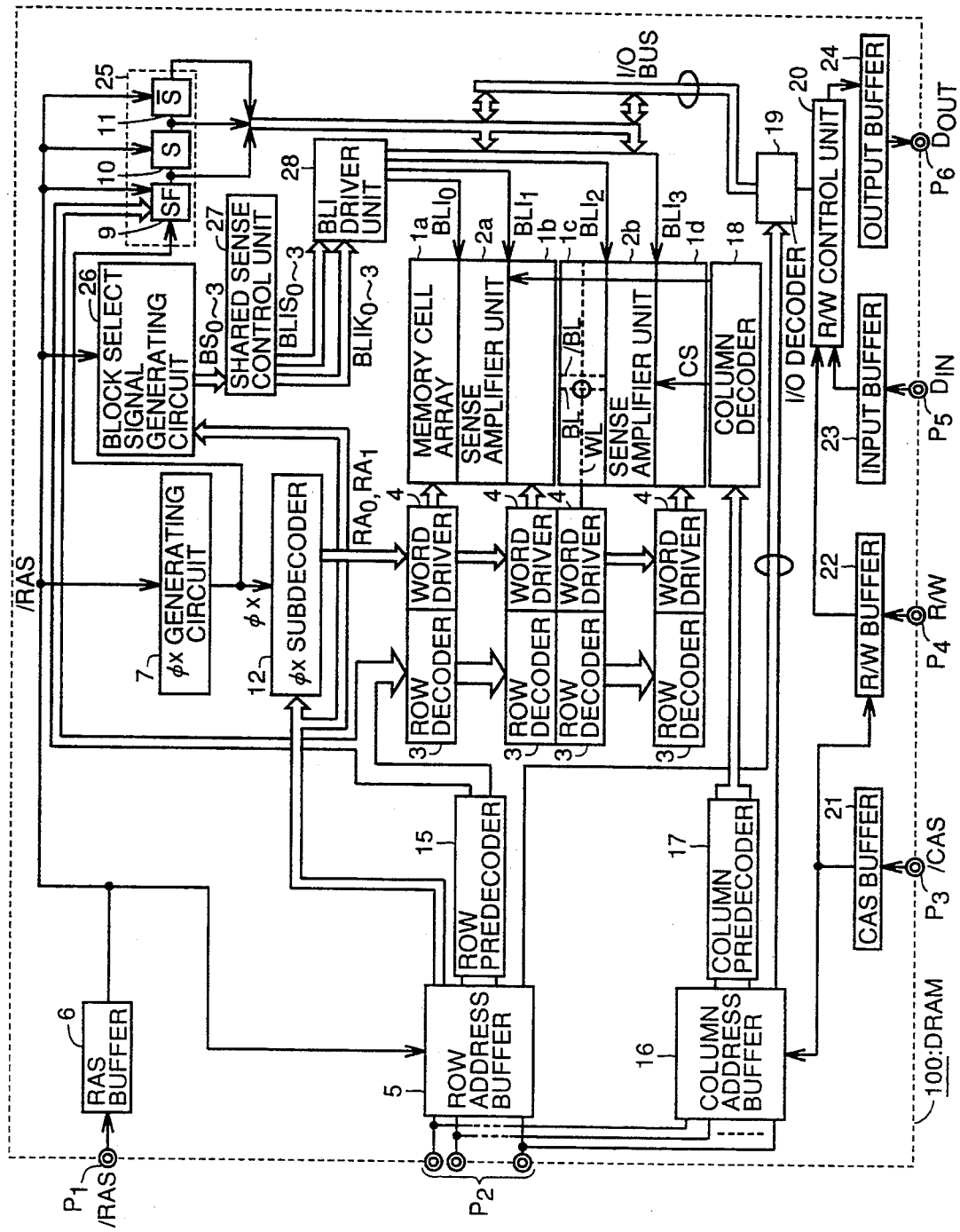
FIG. 9 is a block diagram showing a configuration of a conventional semiconductor device.
Figure 10:
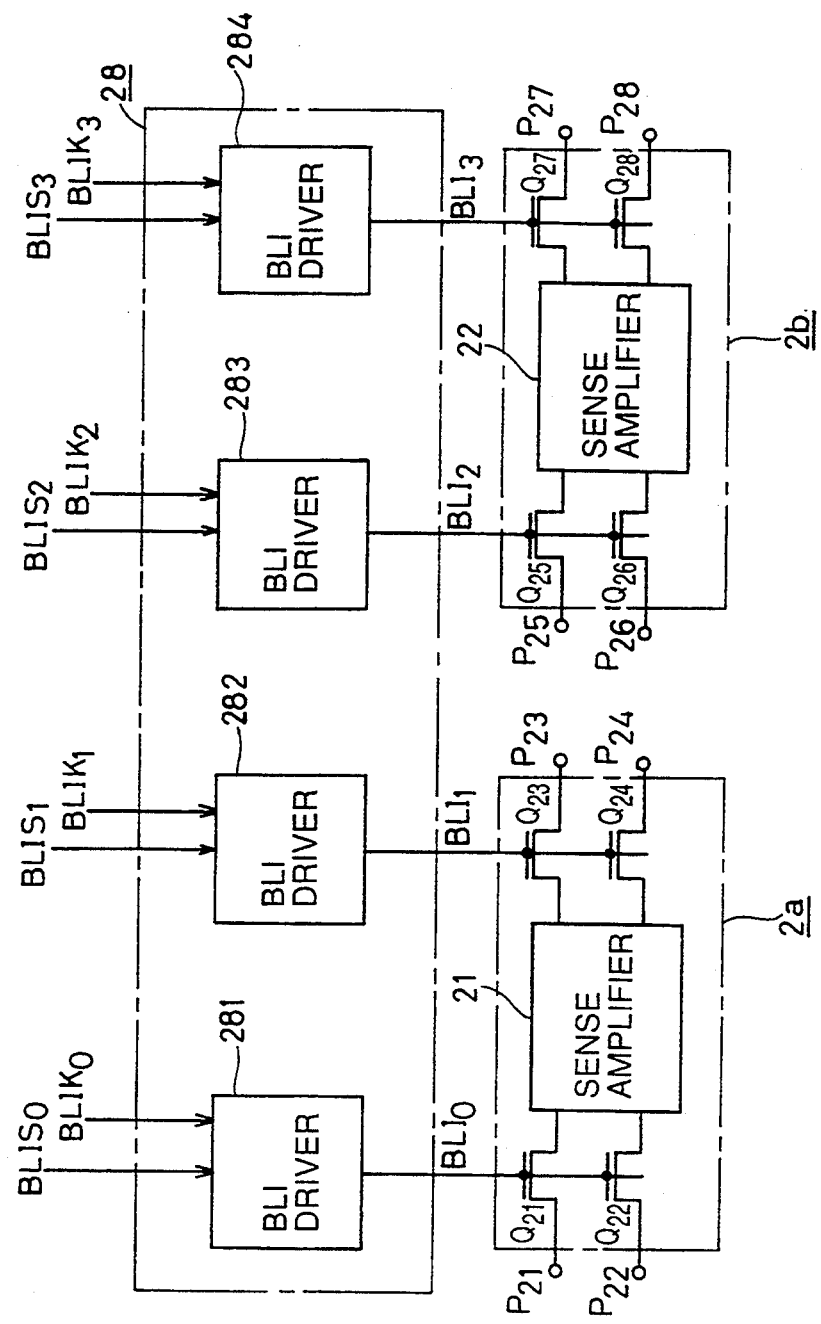
FIG. 10 is a diagram showing a configuration of a BLI driver unit and sense amplifier unit of the conventional semiconductor device.

DRAM 100 shown in FIG. 1 and the conventional DRAM 200 shown in FIG. 9 have substantially the same configuration except block select signal generating circuit 8, shared sense control unit 13, and BLI driver unit 14. The same or corresponding portions are labeled with the same reference characters, and the description will not be repeated.

Block select signal generating circuit 8, shared sense control unit 13, and BLI driver unit 14 will be described in detail hereinafter.

To block select signal generating circuit 8, input are a row address strobe signal /RAS input from a terminal P1 through RAS buffer 6, and internal row address signals RA0, RA1 output from row address buffer 5. Block select signal generating circuit 8 provides to BLI driver unit 14 a control signal BLIM which is an inverted signal of the row address strobe signal /RAS. Block select signal generating circuit 8 internally generates a row address strobe delay signal /RASD which is a delay signal of the row address strobe signal /RAS, and provides to shared sense control unit 13 block select signals BS0 to BS3 in response to the row address strobe delay signal /RASD and the internal row address signals RA0, RA1. When the row address strobe signal /RAS is at an "H" level (a stand-by state), the block select signals BS0 to BS3 are all output at an "L" level. When the row address strobe signal /RAS is at an "L" level (an active state), depending on combination of the internal row address signals RA0, RA1, only one block select signal out of the control signals BS0 to BS3 is provided at an "L" level, and the other signals are all provided at an "H" level. The block select signals BS0 to BS3 correspond to memory cell arrays 1a to 1d, respectively. When the block select signal is at an "L" level, a predetermined memory cell array is brought to a selected state, and when the block select signal is at an "H" level, a predetermined memory cell array is brought to a non-selected state.

To shared sense control unit 13, input are the block select signals BS0 to BS3 output from block select signal generating circuit 8. In response to the block select signals BS0 to BS3, shared sense control unit 13 provides to BLI driver unit 14 control signals BLIS0 to BLIS3 which are inverted signals of the block select signals BS0 to BS3, and control signals BLIK0 to BLIK3 which are inverted signals of the control signals BLIS0 to BLIS3.

In response to the control signals BLIS0 to BLIS3, BLIK0 to BLIK3 output from shared sense control unit 13, and the control signal BLIM output from block select signal generating circuit 8, BLI driver unit 14 provides the shared sense amplifier control signals BLI0, BLI1 to sense amplifier unit 2a, and provides the shared sense amplifier control signals BLI2, BLI3 to sense amplifier unit 2b. Although the "H" level of the control signals BLIS0 to BLIS3, BLIK0 to BLIK3, and BLIM is a power supply voltage $V_{CC}$ level, the "H"

level of the shared sense amplifier control signals BLI0 to BLI3 converted by BLI driver unit 14 attains a boosted voltage $V_{PP}$ level. When the device is in a stand-by state, the shared sense amplifier control signals BLI0 to BLI3 are provided at an "H" level (boosted voltage $V_{PP}$). When the device is in an active state, one of the shared sense amplifier control signals is at an "H" level (boosted voltage $V_{PP}$), and selects a predetermined memory cell array. The other shared sense amplifier control signals attain an "L" level, to be in a non-selected state.

Description will now be given of block select signal generating circuit 8 in detail with reference to FIG. 2.

Figure 2:
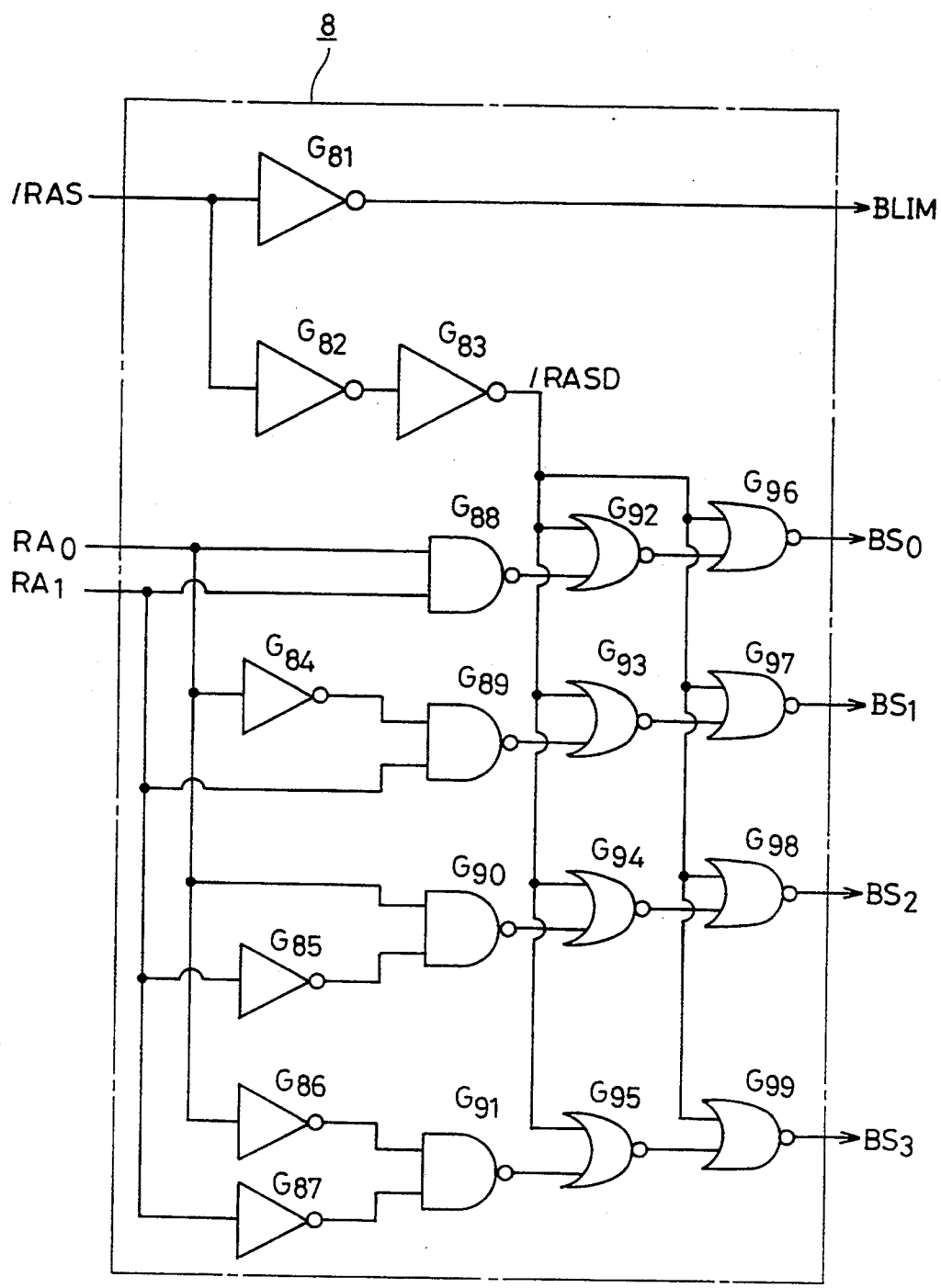
FIG. 2 is a diagram showing a configuration of a block select signal generating circuit of the semiconductor device according to the first embodiment of the present invention.

Referring to FIG. 2, block select signal generating circuit 8 includes gates G81 to G87 serving as inverter circuits, gates G88 to G91 serving as NAND circuits, and gates G92 to G99 serving as NOR circuits.

The row address strobe signal /RAS is input to gate G81, and the control signal BLIM is output as an inverted signal. The row address strobe signal /RAS is input to gate G82. After being inverted, the row address strobe signal /RAS is input to gate G83. The row address strobe signal /RAS is further inverted, and the row address strobe delay signal /RASD is output from gate G83 as a delay signal. The internal row address signals RA0, RA1 are input to gate G88, and an inverted signal of a logical product thereof is input to gate G92. An output signal of gate G88 and the row address strobe delay signal /RASD are input to gate G92, and an inverted signal of a logical sum thereof is input to gate G96. An output signal of gate G92 and the row address strobe delay signal /RASD are input to gate G96, and an inverted signal of a logical sum thereof is output from gate G96 as the block select signal BS0.

The internal row address signal RA0 inverted through gate G84 and the internal row address signal RA1 are input to gate G89, and an inverted signal of a logical product thereof is input to gate G93. An output signal of gate G89 and the row address strobe delay signal /RASD are input to gate G93, and an inverted signal of a logical sum thereof is input to gate G97. An output signal of gate G93 and the row address strobe delay signal /RASD are input to gate G97, and an inverted signal of a logical sum thereof is output from gate G97 as the block select signal BS1.

The internal row address signal RA0 and the internal row address signal RA1 inverted through gate G85 are input to gate G90, and an inverted signal of a logical product thereof is input to gate G94. An output signal of gate G90 and the row address strobe delay signal /RASD are input to gate G94, and an inverted signal of a logical sum thereof is input to gate G98. An output signal of gate G94 and the row address strobe delay signal /RASD are input to gate G98, and an inverted signal of a logical sum thereof is output from gate G98 as the block select signal BS2.

The internal row address signal RA0 inverted through gate G86 and the internal row address signal RA1 inverted through gate G87 are input to gate G91, and an inverted signal of a logical product thereof is input to gate G95. An output signal of gate G91 and the row address strobe delay signal /RASD are input to gate G95, and an inverted signal of a logical sum thereof is input to gate G99. An output signal of gate G95 and the row address strobe delay signal /RASD are input to gate G99, and an inverted signal of a logical sum thereof is output from gate G99 as the block select signal BS3.

Description will now be given of operation of block select signal generating circuit 8 at the time of standby. At stand-by, the row address strobe delay signal /RASD is at an "H" level. Therefore, irrespective of the level of the internal row address signals RA0, RA1, the block select signals BS0 to BS3 all attain an "L" level.

The operation in an active period will now be described. In the active period, since the row address strobe delay signal /RASD attains an "L" level, block select signal generating circuit 8 is activated. At this time, only one of the block select signals BS0 to BS3 is provided at an "L" level depending on combination of levels of the internal row address signals RA0, RA1. The other block select signals all attain an "H" level. If both the internal row address signals RA0, RA1 are at an "H" level, for example, the block select signal BS0 attains an "L" level, and the other block select signals BS1 to BS3 all attain an "H" level.

Because of the above-described configuration, block select signal generating circuit 8 outputs the control signal BLIM which is a delay signal of the row address strobe signal /RAS. Depending on combination of levels of the internal row address signals RA0, RA1, block select signal generating circuit 8 provides one of the block select signals BS0 to BS3 at an "L" level, and the other block select signals at an "H" level. Block select signal generating circuit 8 can provide a block select signal which selects a predetermined memory cell array.

Figure 3:
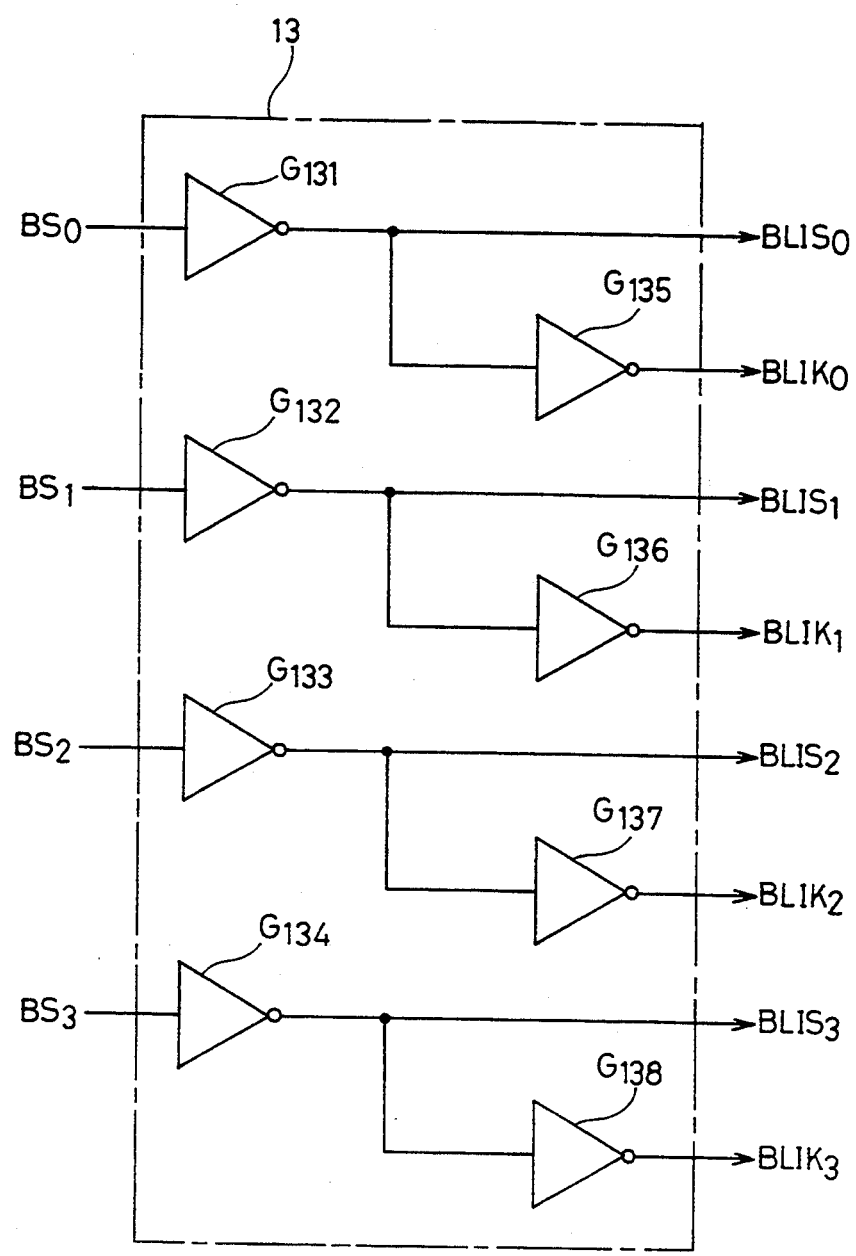
FIG. 3 is a diagram showing a shared sense control unit of the semiconductor device according to the first embodiment of the present invention.

Description will now given of shared sense control unit 13 in detail with reference to FIG. 3.

Referring to FIG. 3, shared sense control unit 13 includes gates G131 to G138 serving as inverter circuits. The block select signal BS0 is input to gate G131. After being inverted, the block select signal BS0 is provided as the control signal BLIS0. The output of gate G131 is input to gate G135, and provided as the control signal BLIK0 after being inverted. As to the block select signals BS1 to BS3, the similar operation is carried out. The block select signals BS1 to BS3 are output as the control signals BLIS1 to BLIS3, BLIK1 to BLIK3, respectively.

Figure 4:
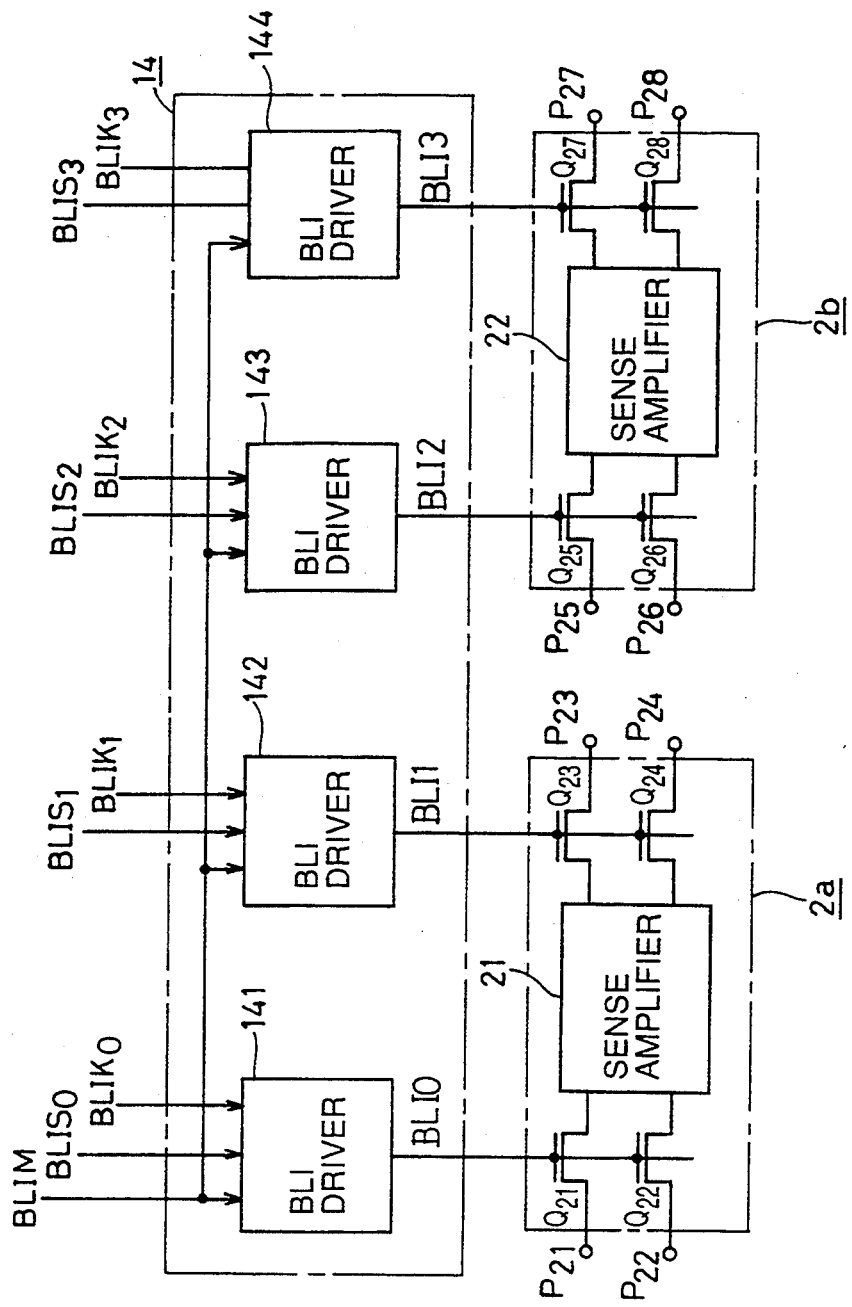
FIG. 4 is a diagram showing a configuration of a BLI driver unit and sense amplifier unit of the semiconductor device according to the first embodiment of the present invention.

BLI driver unit 14 will now be described in detail with reference to FIG. 4 showing the configuration of BLI driver unit 14 and sense amplifier units 2a, 2b.

Referring to FIG. 4, BLI driver unit 14 includes BLI drivers 141 to 144. The control signals BLIM, BLIS0, BLIK0 are input to BLI driver 141, and the shared sense amplifier control signal BLI0 controlling connection of sense amplifier 21 and bit lines BL0, /BL0 of memory cell array 1a is input to transistors Q21, Q22. When the shared sense amplifier control signal BLI0 is at an "H" level, transistors Q21, Q22 are turned on, and the bit lines BL0, /BL0 of memory cell array 1a connected to terminals P21, P22 are connected to sense amplifier 21. When the shared sense amplifier control signal BLI0 is at an "L" level, transistors Q21, Q22 are turned off, and the bit lines BL0, /BL0 of memory cell array 1a are disconnected from sense amplifier 21. BLI drivers 142 to 144 are configured similar to BLI driver 141. Connection of each sense amplifier and bit lines BL1 to BL3, /BL1 to /BL3 of each memory cell array is controlled by the shared sense amplifier control signals BLI1 to BLI3.

Because of the above-described configuration, in the active period, one of the shared sense amplifier control signals BLI0 to BLI3 attains an "H" level, and the bit lines BL, /BL of a predetermined memory cell array and a predetermined sense amplifier can be connected.

Description will now be given of the sense amplifier shown in FIG. 4 in more detail.

Figure 13:
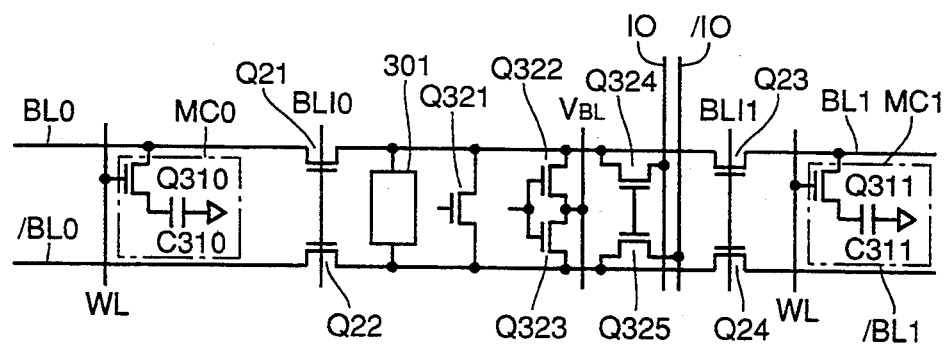
FIG. 13 is a diagram showing a configuration of a sense amplifier shown in FIG. 4.

Referring to FIG. 13, the sense amplifier includes a sense amplifier circuit 301, and transistors Q321 to Q325.

A memory cell MC0 includes a transistor Q310 and a capacitor C310. Memory cell MC0 is connected to a word line WL and a bit line BL0. A bit line pair BL0, /BL0 complementary to each other is connected to the sense amplifier through transistors Q21, Q22 serving as a transfer gate. Similarly, a bit line pair BL1, /BL1 complementary to each other is also connected to the sense amplifier through transistors Q23, Q24.

Sense amplifier circuit 301 differentially amplifies data signal transmitted from a memory cell to a bit line between the bit line and the other bit line configuring a bit line pair. Transistor Q321 serves as an equalizer equalizing potentials of the bit line pair to each other. Transistors Q322, Q323 serve as a precharge circuit precharging the potential of the bit line pair to a predetermined potential $V_{BL}$. Transistors Q324, Q325 serve as an I/O gate controlling connection of a data input-/output line pair IO, /IO complementary to each other and the bit line pair.

Because of the above-described configuration, the sense amplifier is connected to one of the bit line pairs BL0, /BL0 and BL1, /BL1 through transistors Q21 to Q24. The sense amplifier amplifies a signal of the bit line pair at sense amplifier circuit 301. The amplified signal is provided outside through the data input/output lines IO, /IO. In the writing operation, predetermined data input through the data input/output lines IO, /IO is written in a memory cell.

Description will now be given of a BLI driver with reference to FIG. 5. BLI drivers 142 to 144 have the similar configuration as that of BLI driver 141 shown in FIG. 5.

Figure 5:
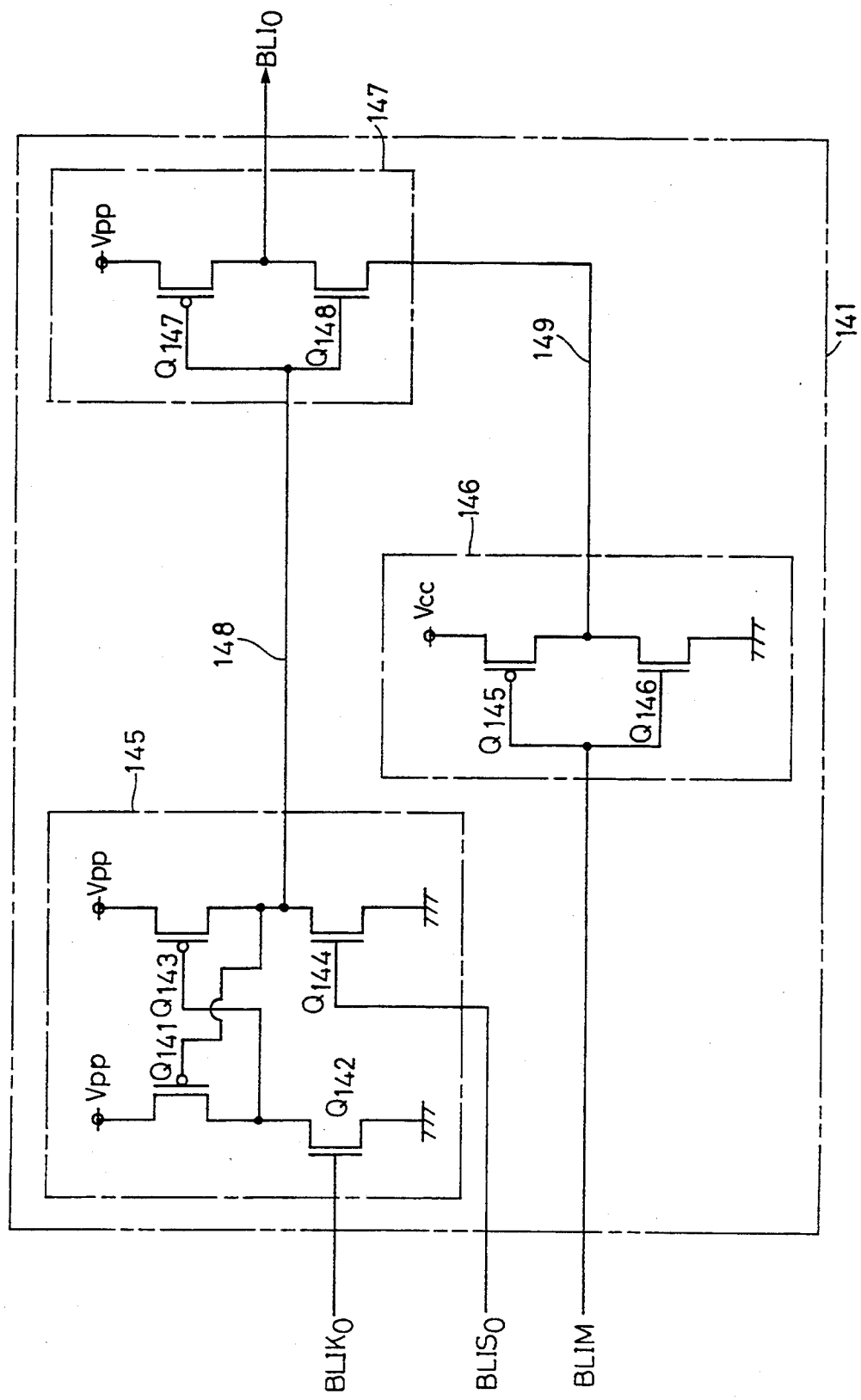
FIG. 5 is a diagram showing a configuration of a BLI driver of the semiconductor device according to the first embodiment of the present invention.

Referring to FIG. 5, BLI driver 141 includes a level converting unit 145, a first level selecting unit 146, and a second level selecting unit 147.

Figure 11:
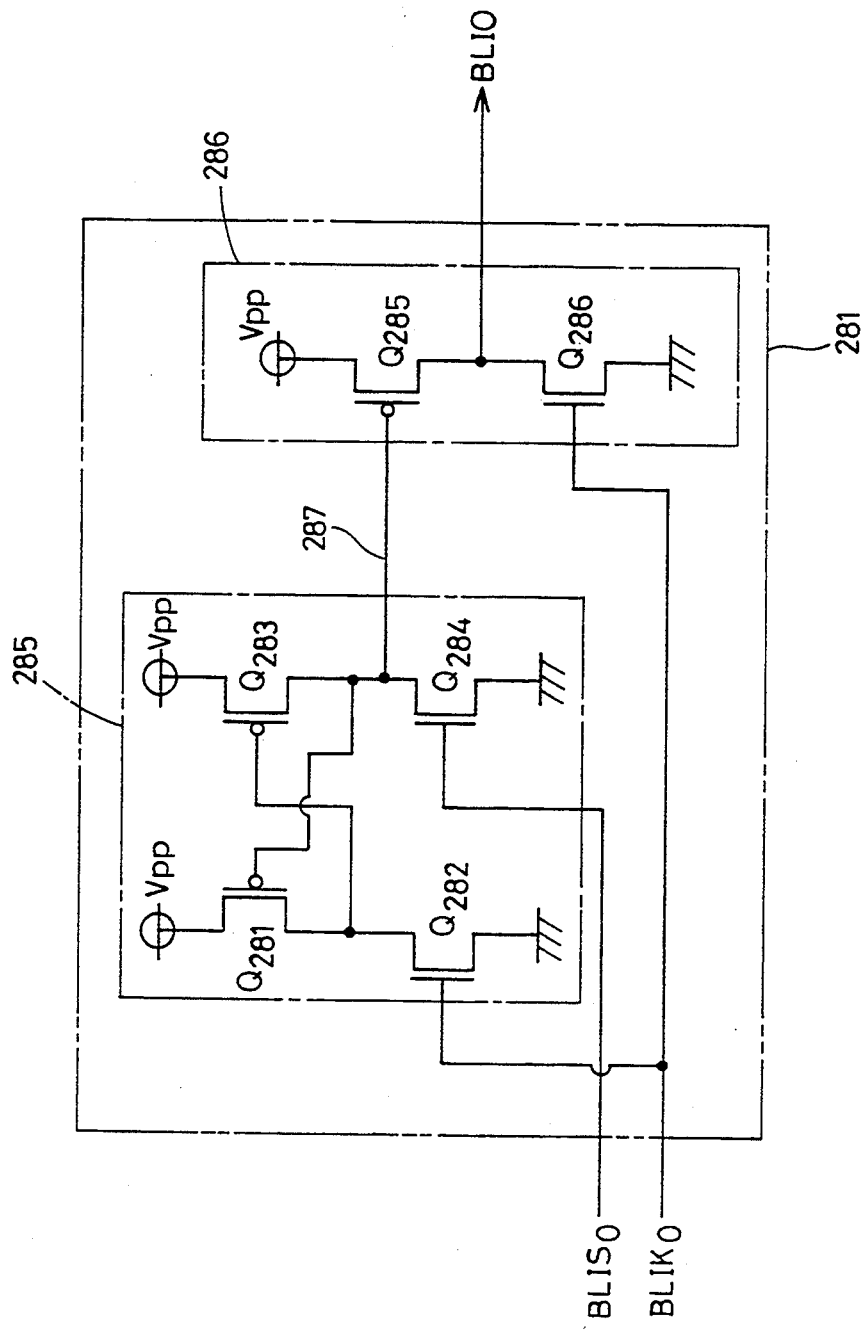
FIG. 11 is a diagram showing a configuration of a BLI driver of the conventional semiconductor device.
Figure 12:
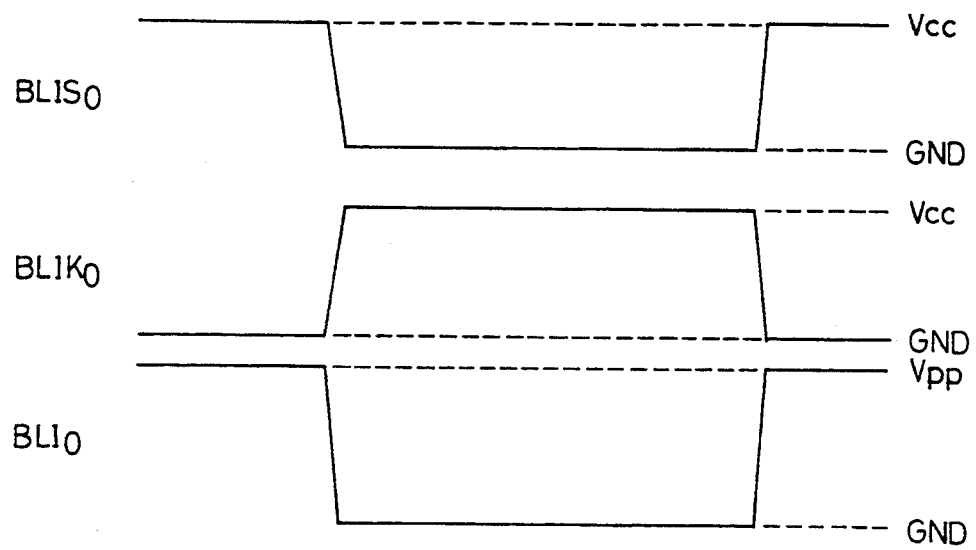
FIG. 12 is a timing chart explaining the operation of the BLI driver of the conventional semiconductor device.

Level converting unit 145 includes transistors Q141, Q143 which are p-channel MOS transistors, and transistors Q142, Q144 which are n-channel MOS transistors. Since level converting unit 145 has the same configuration as that of level converting unit 285 shown in FIG. 11, the detailed description thereof will not be repeated.

When the control signal BLIK0 is at an "H" level (power supply voltage $V_{CC}$ level), that is, when the control signal BLIS0 is at an "L" level, level converting unit 145 outputs a signal at an "H" level (boosted voltage $V_{PP}$ level) as an output signal. When the control signal BLIK0 is at an "L" level (ground potential GND), that is, when the control signal BLIS0 is at an "H" level (power supply voltage $V_{CC}$ level), level converting unit 145 outputs a signal at an "L" level (ground potential GND) as an output signal. As a result, level converting unit 145 can convert a signal at the power supply voltage $V_{CC}$ level into a signal at the boosted voltage $V_{PP}$ level. Since the boosted voltage $V_{PP}$ is supplied similar to the case of the conventional example, it is not shown in FIG. 1.

The boosted voltage generating circuit for supplying the boosted voltage $V_{PP}$ will now be described.

Figure 14:
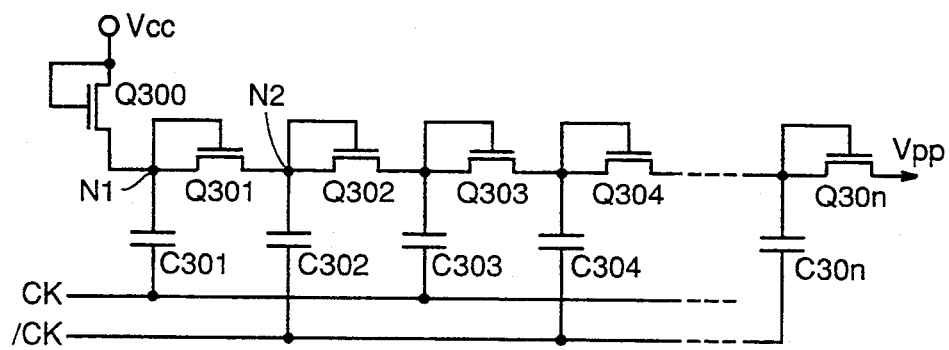
FIG. 14 is a diagram showing a configuration of a boosted voltage generating circuit.

Referring to FIG. 14, the boosted voltage generating circuit includes NMOS transistors Q300 to Q30n, and capacitors C301 to C30n. Transistors Q300 to Q30n are diode-connected, and transistors Q301 to Q30n are further connected to capacitors C301 to C30n, respectively.

Figure 15:
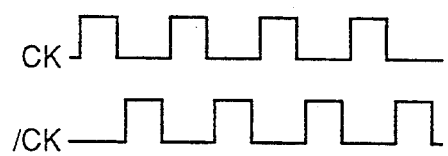
FIG. 15 is a timing chart of a clock signal input to the boosted voltage generating circuit shown in FIG. 14.

The operation of the above-described boosted voltage generating circuit will be described. FIG. 15 is a timing chart of clock signals complementary to each other input to the boosted voltage generating circuit.

Clock signals CK, /CK complementary to each other are input to the boosted voltage generating circuit. After a node N1 is charged to $V_{CC}-V_{th}$ ($V_{th}$ is a threshold voltage of a transistor), the clock signal CK is input, increasing the potential of node N1. Then, transistor Q301 is turned on, and the potential of a node N2 also increases. The clock signal /CK attains an "H" level, and the potential of node N2 further increases. As a result, the boosted voltage generating circuit can generate the boosted voltage $V_{PP}$ higher than the power supply voltage $V_{CC}$ by sending charge stored in capacitors C301 to C30n to the next stage one after another. Because of the above-described operation, the boosted voltage generating circuit can generate a stable boosted voltage $V_{PP}$.

Referring to FIG. 5, first level selecting unit 146 includes a transistor Q145 which is a p-channel MOS transistor, and a transistor Q146 which is an n-channel MOS transistor. Transistor Q145 is supplied with the control signal BLIM at its gate, and connected to the power supply voltage $V_{CC}$ and transistor Q146. Transistor Q146 is supplied with the control signal BLIM at its gate, and connected to the ground potential GND.

When the control signal BLIM is at an "L" level, transistor Q145 is turned on, and transistor Q146 is turned off. As a result, first level selecting unit 146 provides an output signal at an "H" level (power supply voltage $V_{CC}$ level). When the control signal BLIM is at an "H" level (power supply voltage $V_{CC}$ level), transistor Q145 is turned off, and transistor Q146 is turned on. As a result, first level selecting unit 146 outputs a signal at an "L" level (ground potential GND).

Second level selecting unit 147 includes a transistor Q147 which is a p-channel MOS transistor, and a transistor Q148 which is an n-channel MOS transistor. Transistor Q147 is connected to the power supply voltage $V_{PP}$ and transistor Q148, with its gate connected to level converting unit 145. Transistor Q148 is connected to first level selecting unit 146, with its gate connected to level converting unit 145.

When a node 148 of level converting unit 145 is at an "L" level (ground potential GND), transistor Q147 is turned on, and transistor Q148 is turned off. As a result, the shared sense amplifier control signal BLI0 is output at an "H" level (boosted voltage $V_{PP}$ level). When node 148 is at an "H" level (boosted voltage $V_{PP}$ level), transistor Q147 is turned off, and transistor Q148 is turned on. As a result, the shared sense amplifier control signal BLI0 at the level of a node 149 of first level selecting unit 146 is provided. More specifically, when node 149 is at an "H" level (power supply voltage $V_{CC}$ level), the shared sense amplifier control signal BLI0 is output at an "H" level (power supply voltage $V_{CC}$ level). When node 149 is at an "L" level (ground potential GND), the shared sense amplifier control signal BLI0 is output at an "L" level (ground potential GND).

Because of the above-described configuration of BLI driver 141, when the control signal BLIS0 is at an "H" level (power supply voltage $V_{CC}$ level), the shared sense amplifier control signal BLI0 is output at an "H" level (boosted voltage $V_{PP}$ level). When the control signal BLIK0 is at an "L" level, and the control signal BLIM is at an "H" level (power supply voltage $V_{CC}$ level), the shared sense amplifier control signal BLI0 is output at an "L" level (ground potential GND). On the other hand, when the control signal BLIS0 is at an "L" level (ground potential GND), and the control signal BLIM is at an "L" level (ground potential GND), the shared sense amplifier control signal BLI0 is output at an "H" level (power supply voltage $V_{CC}$ level). Therefore, depending on levels of the control signals BLIS, BLIM, the shared sense amplifier control signal BLI0 of three levels of the ground potential GND, the power supply voltage $V_{CC}$ level, and the boosted voltage $V_{PP}$ level can be output.

Description will now be given of operation of the dynamic type semiconductor memory device configured as described above.

Figure 6:
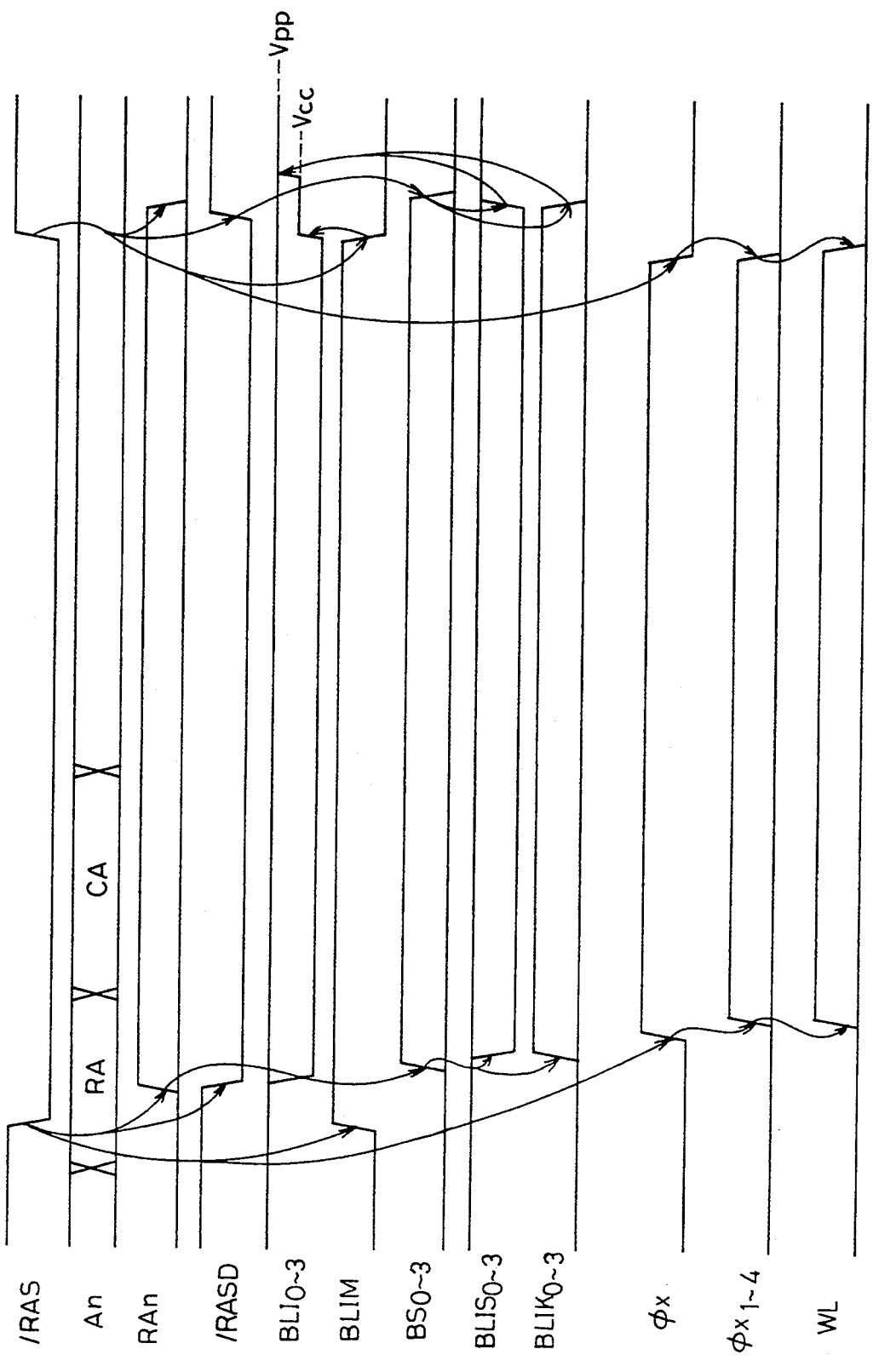
FIG. 6 is a timing chart explaining the operation of the semiconductor device according to the first embodiment of the present invention.

Referring to FIG. 6, when the device is in a stand-by state, the row address strobe signal /RAS is at an "H" level. When the row address strobe signal /RAS falls to an "L" level and the device enters an active state, externally applied address signals An (A0 to A8) are incorporated in the device as a row address RA, and an internal row address signal RAn is output.

When the row address strobe signal /RAS falls to an "L" level, a word line drive master signal $\phi x$ rises to an "H" level after being delayed for a predetermined time. $\phi x$ subdecoder 12 generates word line subdecode signals $\phi x1$ to $\phi x4$ in response to the internal row address signal RAn and the word line drive master signal $\phi x$. In this case, only one of the word line subdecode signals $\phi x1$ to $\phi x4$ rises to an "H" level.

In response to the word line subdecode signals $\phi x1$ to $\phi x4$, one word line is selected, and one of the word lines WL rises to an "H" level. As a result, signal charge stored in a memory cell connected to the selected word line is transmitted onto a bit line, and a sense period starts.

When the row address strobe signal /RAS falls to an "L" level, the row address strobe delay signal /RASD, which is a delay signal, falls to an "L" level after a predetermined time. When the row address strobe signal RAS falls to an "L" level, the control signal BLIM, which is an inverted signal, rises to an "H" level.

When the row address strobe delay signal /RASD falls, block select signal generating circuit 8 is activated, and, except one of the block select signals BS0 to BS3 selected depending on combination of the internal row address signals RA0, RA1, the other three rise to an "H" level.

When three of the block select signals BS0 to BS3 rise to an "H" level, except one of the control signals BLIS0 to BLIS3 selected by shared sense control unit 13, the other three control signals fall to an "L" level. Similarly, three out of the control signals BLIK0 to BLIK3 rise to an "H" level. At this time, BLI driver unit 14 pulls down three of the shared sense amplifier control signals BLI0 to BLI3 excluding the selected shared sense amplifier control signal from an "H" level (boosted voltage $V_{PP}$ level) to an "L" level (ground potential GND). As a result, a predetermined memory cell array is connected to a corresponding sense amplifier, and brought to a selected state. The other memory cell arrays are brought to a non-selected state.

When the row address strobe signal /RAS rises to an "H" level, the internal row address signal RAn, the word line drive master signal $\phi x$, the word line subdecode signals $\phi x1$ to $\phi x4$, and the word line WL attain an "L" level, and the sense period is completed. The device again returns to the stand-by state.

When the row address strobe signal /RAS rises to an "H" level, block select signal generating circuit 8 pulls down the control signal BLIM, which is an inverted signal, to an "L" level. When the control signal BLIM falls to an "L" level, a signal at an "L" level out of the shared sense amplifier control signals BLI0 to BLI3 rises to the power supply voltage $V_{CC}$ level. At this time, since the boosted voltage $V_{PP}$ is not used, the device is not affected by a loss caused by conversion. Current consumption is not increased, and power consumption can be reduced.

Then, the row address strobe signal /RAS rises to an "H" level, and the row address strobe delay signal /RASD, which is a delay signal, rises to an "H" level after a predetermined time. When the row address strobe delay predetermined time. When the row address strobe delay signal /RASD rises to an "H" level, the block select signals BS0 to BS3 attain an "L" level. When the block select signals BS0 to BS3 attain an "L" level, the control signals BLIS0 to BLIS3 attain an "H" level, and the control signals BLIK0 to BLIK3 attain an "L" level. When the control signals BLIS0 to BLIS3 attain an "H" level, the shared sense amplifier control signals BLI0 to BLI3 attain an "H" level (boosted voltage $V_{PP}$ level). As a result, it is possible to pull up three non-selected signals out of the shared sense amplifier control signals BLI0 to BLI3 from the power supply voltage $V_{CC}$ level to the boosted voltage $V_{PP}$ level.

Because of the above-described operation of the device, the shared sense amplifier control signal selected in the active period is input to a transistor controlling connection of a sense amplifier and a bit line of a memory cell array at the boosted voltage $V_{PP}$ level. Therefore, even if the power supply voltage is unstable, the device will not malfunction. When a non-selected shared sense amplifier control signal is pulled up from the ground potential GND to the boosted voltage $V_{PP}$ level, the signal is once pulled up to the power supply voltage $V_{CC}$ level, and then pulled up to the boosted voltage $V_{PP}$ level. Therefore, the device is not affected by a loss caused by boosting until the non-selected shared sense amplifier control signal is pulled up to the power supply voltage $V_{CC}$ level. The current consumption will not increase, and power consumption by BLI drivers 141 to 144 can be substantially reduced. Since each voltage is stable, it is possible to output a stable shared sense amplifier control signal, making it possible to implement stable operation of the device.

The effect of reduction of power consumption obtained by the present invention will be described specifically. A current I consumed in a rising from the ground potential GND to the boosted voltage $V_{PP}$ level is expressed by the following equation.

$$I = (V_{PP} \cdot C_P)/(t_C \cdot a)$$

In the above equation, $C_P$ is a load capacitance in rising, $t_C$ is a cycle time, and a is an efficiency in producing the boosted power supply voltage $V_{PP}$ level.

If $V_{PP} = 5.5$ V, for example, a consumed current $I_0$ in the case of an abrupt rise up to the boosted voltage $V_{PP}$ level as in the conventional example is 13.75 $C_P/t_C$ (mA), providing that the conversion efficiency a is 0.4. On the other hand, in the case where a signal is once pulled up to the power supply voltage $V_{CC}$ level as in the present invention, the conversion efficiency a can be set to 1 because of no loss caused by conversion. If the power supply voltage $V_{CC}$ is 3.3 V, a current $I_a$ consumed in a rising to the power supply voltage $V_{CC}$ level is 3.3 $C_P/t_C$ (mA). A current $I_B$ consumed in a rising from the power supply voltage $V_{CC}$ level to the boosted voltage $V_{PP}$ level is 5.5 $C_P/t_C$ (mA). Therefore, the entire current consumption $I_1$ is 8.8 $C_P/t_C$ (mA). As a result, consumed current becomes 64% of that of the conventional example. Since power consumption is proportional to square of current consumption, power consumption becomes 41% of that of the conventional example, making it possible to reduce the power consumption by 59% compared to the conventional example.

When the present invention is applied to the dynamic type semiconductor memory device as in this embodiment, a signal line is long transmitting a shared sense amplifier control signal which will be a load at the time of charging. Therefore, a load capacitance is increased, and the effect of reduction of power consumption is more significant.

Description will now be given of operation at the time of read, write, refresh, or the like. At the time of read, data read out from a memory cell selected in response to the shared sense amplifier control signal BLI is amplified by a sense amplifier and to output to a data input/output line finally. At the time of write, after data input from the data input/output line is amplified to a predetermined level by the sense amplifier, the data is written in a memory cell connected to a bit line corresponding to the shared sense amplifier control signal BLI. At the time of refresh, data read out to a bit line from a memory cell corresponding to the shared sense amplifier control signal BLI is amplified by the sense amplifier, and written again in a memory cell through a bit line.

Description will now be given in detail of operation at the time of self-refresh. At the time of self-refresh, since the row address strobe signal /RAS serving as an original signal of each above control signal is not input, the self-refresh operation cannot be carried out. Therefore, it is necessary to provide a circuit generating a pseudo internal row address strobe signal /RAS in response to a signal instructing the self-refresh operation.

Figure 16:
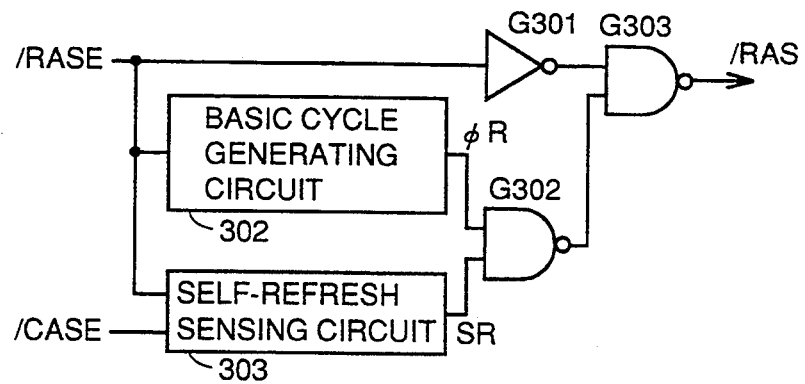
FIG. 16 is a diagram showing a configuration of a self-refresh control signal generating circuit.

Referring to FIG. 16, the self-refresh control signal generating circuit includes a basic cycle generating circuit 302, a self-refresh sensing circuit 303, an inverter G301, and gates G302, G303. The self-refresh control signal generating circuit is provided between RAS buffer 6 and block select signal generating circuit 8, for example.

Externally applied external row address strobe signal /RASE and external column address strobe signal /CASE are input to self-refresh sensing circuit 303. As one example, in response to a timing of CBR (/CAS before /RAS) refresh, self-refresh sensing circuit 303 senses the self-refresh operation, and outputs a self-refresh sense signal SR to gate G302 at an "H" level.

External row address strobe signal /RASE is input to basic cycle generating circuit 302. In response to the external row address strobe signal /RASE, basic cycle generating circuit 302 outputs a clock signal $\phi_R$ to gate G302 in a predetermined cycle. Gate G302 carries out a logical product operation between the input self-refresh sense signal SR and the clock signal $\phi_R$. Gate G302 inverts the result to output the same to gate G303. The external row address strobe signal /RASE is input to gate G303 through inverter G301. Gate G303 carries out a logical product operation between inverter G301 and the output signal of gate G302. Gate G303 inverts the result, and outputs the same as the row address strobe signal /RAS internally used.

Figure 17:
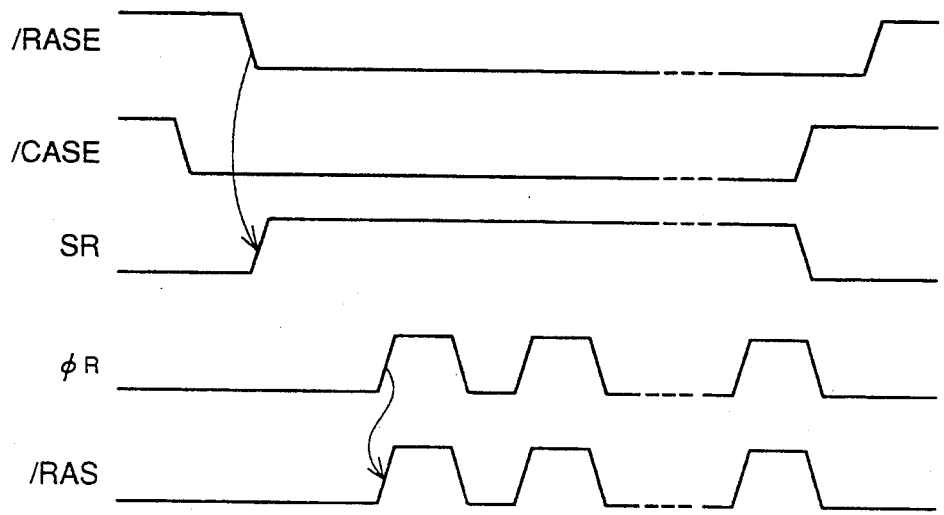
FIG. 17 is a timing chart explaining the operation of the self-refresh control signal generating circuit shown in FIG. 16.

Referring to FIG. 17, when the external row address strobe signal /RASE falls from an "H" level to an "L" level after the external column address strobe signal /CASE changes from an "H" level to an "L" level, self-refresh sensing circuit 303 senses entry of the operating state into the self-refresh mode, and pulls up the self-refresh sense signal SR from an "L" level to an "H" level. In response to the external row address strobe signal /RASE, basic cycle generating circuit 302 outputs the clock signal $\phi_R$ in a predetermined frequency. At this time, since the external row address strobe signal /RASE is at an "L" level, a signal of waveform similar to that of the clock signal $\phi_R$ is finally output as the row address strobe signal /RAS by inverter G301, gates G302 and G303.

Because of the above-described operation, even in the self-refresh mode when the row address strobe signal /RASE is not externally applied, it is possible to internally generate a pseudo row address strobe signal /RAS having a predetermined cycle. Therefore, by block select signal generating circuit 8 operating in response to the generated row address strobe signal /RAS, the device can operate similarly even at the time of self-refresh. The self-refresh control signal generating circuit shown in FIG. 16 detects a timing of self-refresh operation by detection of a timing of the CBR refresh. However, any circuit which can similarly detect a timing of self-refresh operation by detection of other timings such as RAS only refresh can generate a pseudo row address strobe signal /RAS, similarly.

Description will now be given of the semiconductor device according to the second embodiment of the present invention with reference to FIG. 7. In the second embodiment, since units other than the BLI driver unit have the same configuration as that of the semiconductor device shown in FIG. 1, description will not be repeated.

Figure 7:
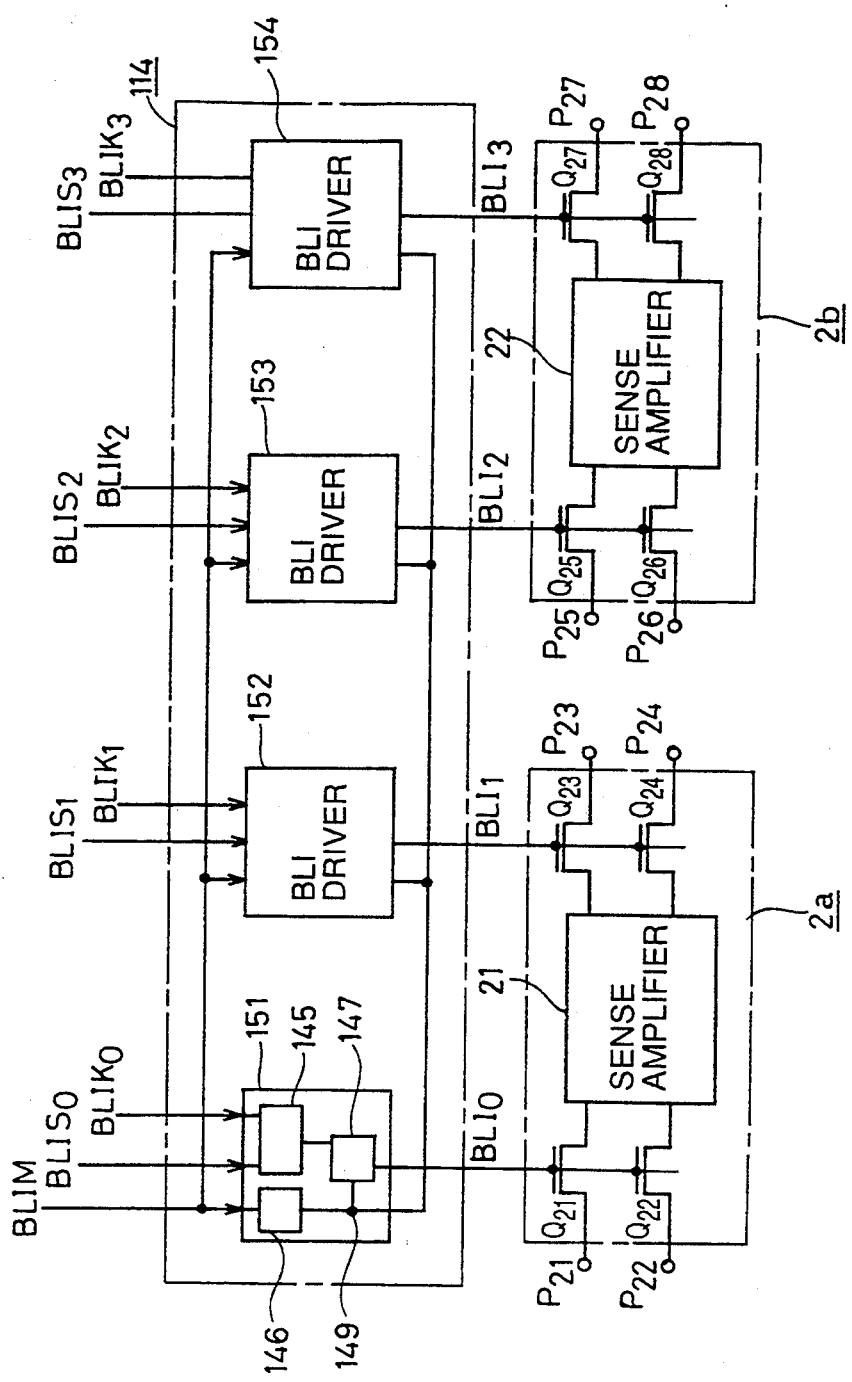
FIG. 7 is a diagram showing a configuration of a BLI driver unit and sense amplifier unit of a semiconductor device according to a second embodiment of the present invention.

Referring to FIG. 7, BLI driver unit 114 includes BLI drivers 151 to 154. BLI driver 151 includes level converting unit 145, first level selecting unit 146, and second level selecting unit 147. Since the configuration of level converting unit 145, first level selecting unit 146, and second level selecting unit 147 is the same as that shown in FIG. 5, the description will not be repeated. In this embodiment, node 149 between first level selecting unit 146 and second level selecting unit 147 is connected to nodes 149 of the other BLI drivers 152 to 154. Node 149 is shared among respective BLI drivers. In this case, node 149 can be charged to the power supply voltage $V_{CC}$ level by transistor Q145 of first level selecting unit 146, and node 149 can be discharged to the ground potential GND by a plurality of transistors Q146, thereby increasing the operation speed. Since node 149 and a resistance between respective potentials are connected in parallel, the resistance becomes small, whereby power consumption can be further decreased.

Description will now be given of the semiconductor device according to the third embodiment of the present invention with reference to FIG. 8. Since the configuration of this embodiment other than the BLI driver is similar to that of the semiconductor device shown in FIG. 1, the description will not be repeated.

Figure 8:
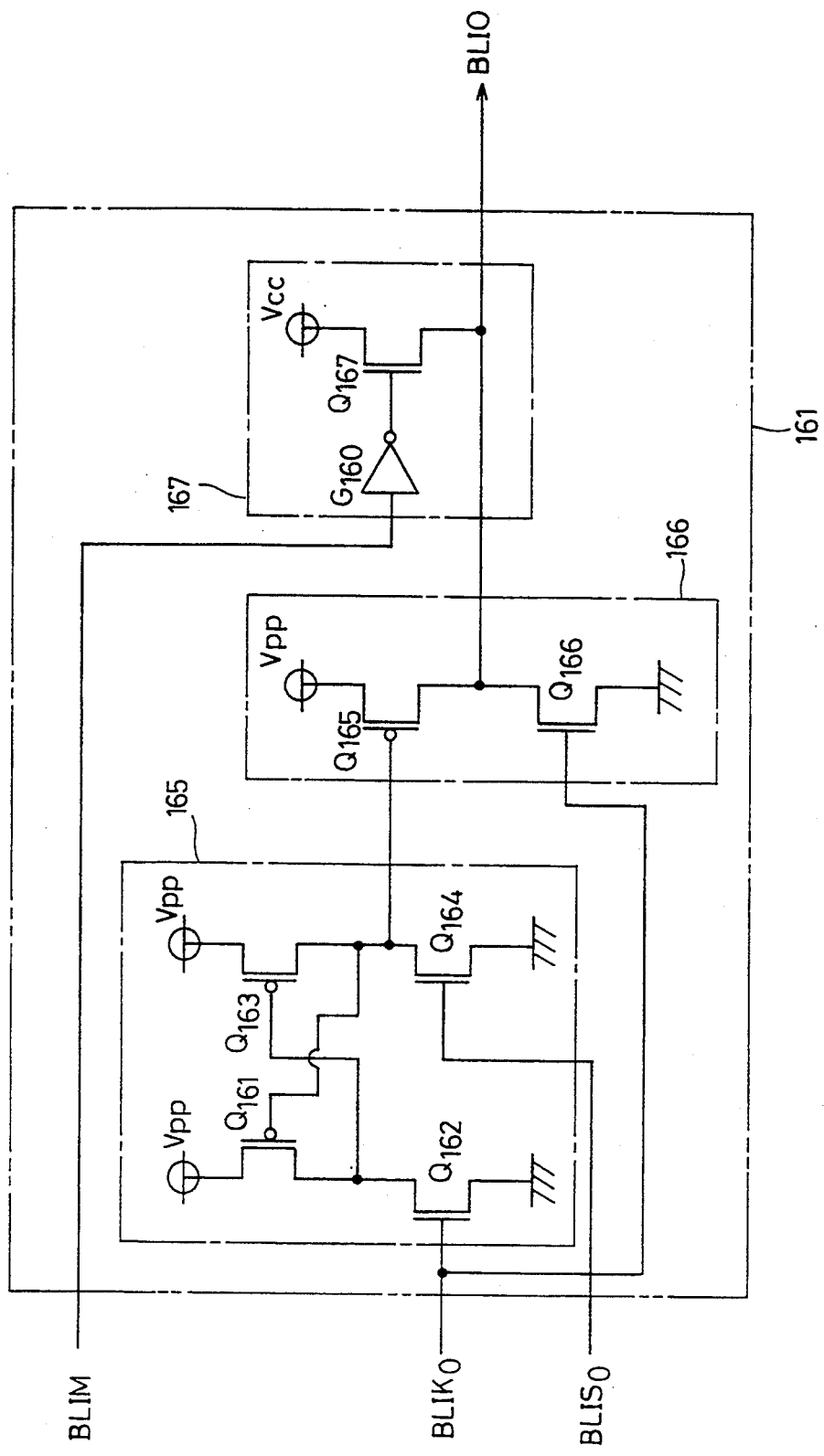
FIG. 8 is a diagram showing a configuration of a BLI driver of a semiconductor device according to a third embodiment of the present invention.

Referring to FIG. 8, a BLI driver 161 includes a level converting unit 165, a first level selecting unit 166, and a second level selecting unit 167. Since level converting unit 165 has the same configuration as level converting unit 145 shown in FIG. 5, the description will not be repeated.

First level selecting unit 166 includes a transistor Q165 which is a p-channel MOS transistor, and a transistor Q166 which is an n-channel MOS transistor. Transistor Q165 is connected to the boosted voltage $V_{PP}$ and transistor Q166, with its gate connected to level converting unit 165. Transistor Q166 is connected to the ground potential GND, and supplied with the control signal BLIK0 at its gate.

Second level selecting unit 167 includes a gate G160 serving as an inverter circuit, and a transistor Q167 which is an n-channel MOS transistor. Transistor Q167 is connected to the power supply voltage $V_{CC}$ and first level selecting unit 166, with its gate connected to gate G160.

When the control signal BLIS0 is at an "H" level (power supply voltage $V_{CC}$ level), and the control signal BLIK0 is at an "L" level (ground potential GND), the output signal of level converting unit 165 attains an "L" level, transistor Q165 is turned on, and transistor Q166 is turned off. As a result, a signal at an "H" level (boosted voltage $V_{PP}$ level) is provided as an output signal of first level selecting unit 166. In this case, since the boosted voltage $V_{PP}$ is larger than the power supply voltage $V_{CC}$, irrespective of transistor Q167 being on or off, second level selecting unit 167 outputs the shared sense amplifier control signal BLI0 at an "H" level (boosted voltage $V_{PP}$ level).

When the control signal BLIS0 is at an "L" level (ground potential GND), and the control signal BLIK0 is at an "H" level (power supply voltage $V_{CC}$ level), the output signal of level converting unit 165 is provided at an "H" level (boosted voltage $V_{PP}$ level), transistor Q165 is turned off, and transistor Q166 is turned on. As a result, the output signal of first level selecting unit 166 is provided at an "L" level (ground potential GND). In this case, if the control signal BLIM is at an "L" level, the output signal of gate G160 is provided at an "H" level (power supply voltage $V_{CC}$ level), and transistor Q167 is turned on. As a result, second level selecting unit 167 outputs the shared sense amplifier control signal BLI0 at an "H" level ($V_{CC}$-$V_{th}$ level), wherein the threshold voltage of transistor Q167 is $V_{th}$. On the other hand, when the control signal BLIM is at an "H" level, transistor Q167 is turned off, and the shared sense amplifier control signal BLI0 is output at an "L" level (ground potential GND).

As described above, according to levels of the control signals BLIS0, BLIK0, and BLIM, BLI driver 161 can output the shared sense amplifier control signal BLI0 at three levels of the ground potential GND, the $V_{CC}$-$V_{th}$ level, and the boosted voltage $V_{PP}$ level. Since the operation of the semiconductor device according to this embodiment to which BLI driver 161 is applied is the same as the operation shown by the timing chart shown in FIG. 6, except that a signal at the $V_{CC}$-$V_{th}$ level rather than a signal of the power supply voltage $V_{CC}$ level is provided when the shared sense amplifier control signal is pulled up to the boosted voltage $V_{PP}$ level, the description will not be repeated.

Because of the above-described configuration, the device is not affected by a loss caused by boosting until the rising to the $V_{CC}$-$V_{th}$ level also in this embodiment.

Since current consumption does not increase, it is possible to reduce power consumption of the device. Since each voltage is stable, it is possible to output a stable shared sense amplifier control signal, whereby the stable operation of the device can be implemented.

In this embodiment, the configuration of BLI driver 161 is simple. The layout area can be reduced, and the semiconductor device can be highly integrated.

Description will be given of one example in which the present invention is applied to $\phi x$ generating circuit 7 shown in FIG. 1. $\phi x$ generating circuit 7 sometimes outputs the word line drive master signal $\phi x$ for driving a word line at the boosted voltage $V_{PP}$ level. Therefore, it is possible to similarly apply each embodiment of the present invention to $\phi x$ generating circuit 7.

Figure 18:
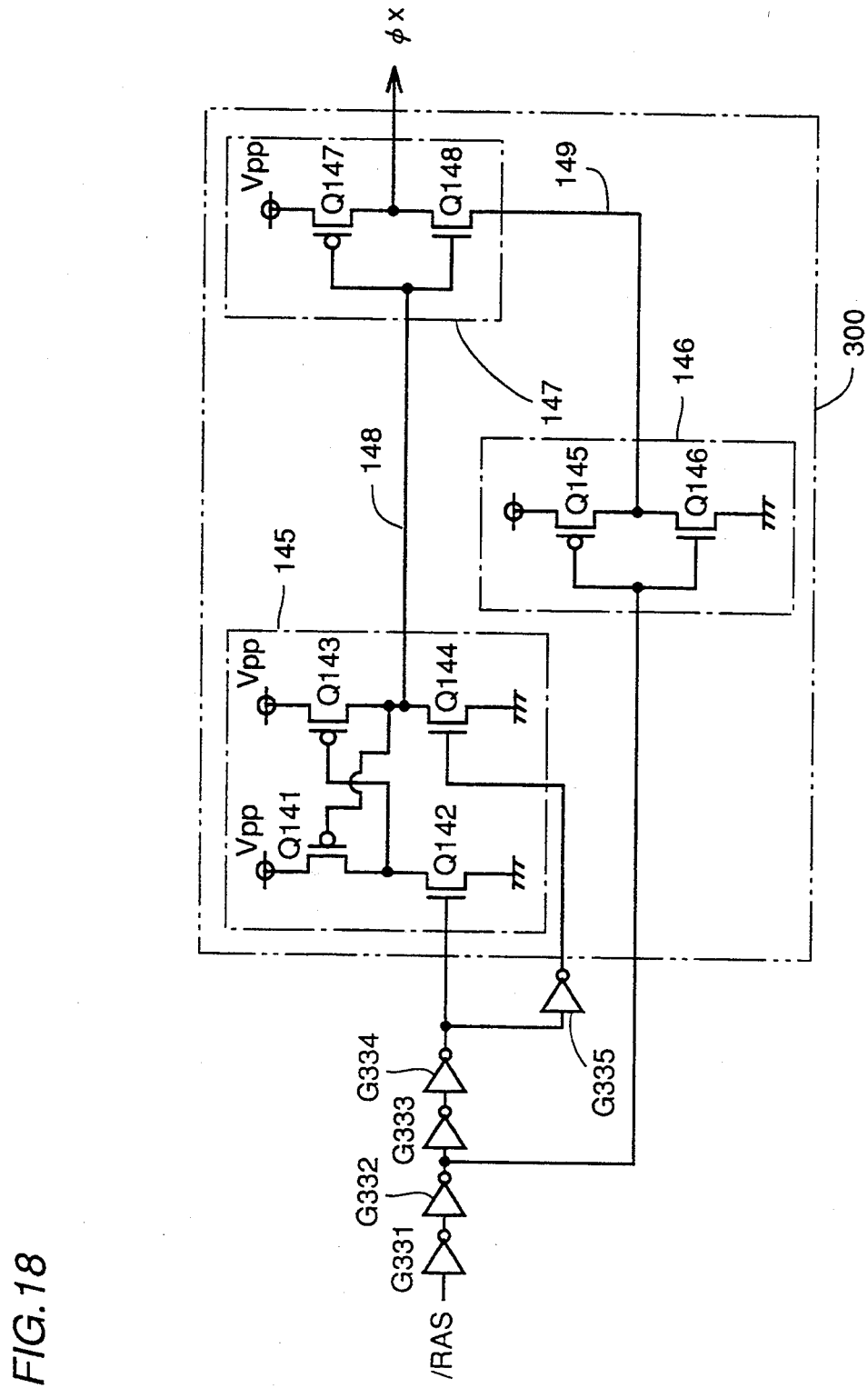
FIG. 18 is a circuit diagram showing a configuration of a $\phi x$ generating circuit.

Referring to FIG. 18, the $\phi x$ generating circuit includes inverters G331 to G335, and a BLI driver 300. Since BLI driver 300 is similar to BLI driver 141 shown in FIG. 5, the same or corresponding portions are labeled with the same reference characters, and the description will not be repeated.

The row address strobe signal /RAS is input to inverter G331 from RAS buffer 6. The row address strobe signal /RAS is output to inverter G333 and first level selecting unit 146 through inverter G332. The signal input to inverter G333 is input to inverter G334 and delayed. The signal is input to the gate of transistor Q142 and the gate of transistor Q144 through inverter G335. Therefore, each signal input to level converting unit 145 is delayed from a signal input to first level selecting unit 146 by a delay time caused by inverters G333 and G334 for input. As a result, BLI driver 300 operates similar to BLI driver 141 shown in FIG. 5. In response to the row address strobe signal /RAS, the word line drive master signal $\phi x$ is output which is once pulled up from the ground potential GND to the power supply voltage $V_{CC}$ level, and then pulled up from the power supply voltage $V_{CC}$ level to the boosted voltage $V_{PP}$ level.

As a conventional method of generating the word line drive master signal $\phi x$, a signal at the power supply voltage $V_{CC}$ level is delayed, charge is stored in a capacitor, and a signal at the boosted voltage level is output. However, in this embodiment, a signal of the similar waveform is output by selecting stably supplied power supply voltage $V_{CC}$ and boosted voltage $V_{PP}$, it is possible to generate the word line drive master signal $\phi x$ at a stable voltage level, whereby the stable operation of the device can be implemented.

In each embodiment described above, the present invention was applied to the dynamic type semiconductor memory device. However, the present invention can be applied to other semiconductor devices to obtain the similar effect, if the devices use the boosted voltage and carry out rising operation up to the boosted voltage level. The present invention can also be applied to other semiconductor devices such as a flash memory device, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device carrying out a predetermined operation in response to a timing at which a third control signal provided in response to first and second control signals changes from a first voltage level to a boosted second voltage level, comprising:

output means for providing said second control signal delayed from said first control signal; and control signal output means for providing said third control signal rising from said first voltage level to said second voltage level, wherein said third control signal is pulled up to a third voltage level which is intermediate between said first voltage level and said second voltage level in response to said first control signal, and then pulled up to said second voltage level in response to said second control signal.

2. The semiconductor device as recited in claim 1, wherein said third voltage level is a power supply voltage level externally supplied to said semiconductor device, said second voltage level is a boosted voltage level obtained by boosting said power supply voltage, and said first voltage level is a ground potential.

3. The semiconductor device as recited in claim 1, wherein said control signal output means includes first selecting means for selectively providing an output signal at said first voltage level or an output signal at said third voltage level in response to said first control signal, and second selecting means for selectively providing an output signal at said second voltage level or an output signal selected by said first selecting means in response to said second control signal.

4. The semiconductor device as recited in claim 3, wherein said second control signal includes a signal at said third voltage level, and said second selecting means includes level converting means for converting said second control signal at said third voltage level into a fourth control signal at said second voltage level for output, and third selecting means for selectively providing an output signal at said second voltage level or an output signal selected by said first selecting means in response to said fourth control signal.

5. The semiconductor device as recited in claim 4, wherein said first selecting means includes a first PMOS transistor connected to a voltage of said third voltage level and having a gate receiving said first control signal, and a first NMOS transistor connected to a voltage of said first voltage level and said first PMOS transistor and having a gate receiving said first control signal, said second control signal includes two complementary signals complementary to each other, said level converting means includes a second PMOS transistor connected to a voltage of said second voltage level, a second NMOS transistor connected to a voltage of said first voltage level and said second PMOS transistor and having a gate receiving one of said complementary signals, a third PMOS transistor connected to a voltage of said second voltage level and having a gate receiving a signal at a connection portion of said second PMOS transistor and said second NMOS transistor, and a third NMOS transistor connected to a voltage of said first voltage level and said third PMOS transistor and having a gate receiving the other of said complementary signals, said second PMOS transistor has a gate receiving a signal at a connection portion of said third PMOS transistor and said third NMOS transistor, said third selecting means includes a fourth PMOS transistor connected to a voltage of said second voltage level and having a gate receiving a signal at a connection portion of said third PMOS transistor and said third NMOS transistor, and a fourth NMOS transistor connected to said fourth PMOS transistor and a connection portion of said first PMOS transistor and said first NMOS transistor, and having a gate receiving a signal at a connection portion of said third PMOS transistor and said third NMOS transistor.

6. The semiconductor device as recited in claim 3, wherein said first and second selecting means are provided in plural, respectively, and respective connection portions of said first selecting means and said second selecting means are connected together.

7. The semiconductor device as recited in claim 1, wherein said control signal output means includes first selecting means responsive to said second control signal for selectively providing an output signal at said first voltage level or an output signal at said second voltage level, and second selecting means responsive to said first control signal for selectively providing an output signal at said third voltage level or an output signal selected by said first selecting means.

8. The semiconductor device as recited in claim 7, wherein said second control signal includes a signal at said third voltage level, said first selecting means includes level converting means for providing a fourth control signal obtained by conversion of said third voltage level of said second control signal into said second voltage level, and third selecting means responsive to said fourth control signal for selectively providing an output signal at said first voltage level or an output signal at said second voltage level.

9. The semiconductor device as recited in claim 8, wherein said second control signal includes two complementary signals complementary to each other, said level converting means includes a first PMOS transistor connected to a voltage of said second voltage level, a first NMOS transistor connected to a voltage of said first voltage level and said first PMOS transistor and having a gate receiving said one complementary signal, a second PMOS transistor connected to a voltage of said second voltage level and having a gate receiving a signal at a connection portion of said first PMOS transistor and said first NMOS transistor, and a second NMOS transistor connected to a voltage of said first voltage level and said second PMOS transistor and having a gate receiving said the other complementary signal, said first PMOS transistor has a gate receiving a signal at a connection portion of said second PMOS transistor and said second NMOS transistor, said third selecting means includes a third PMOS transistor connected to a voltage of said second voltage level and having a gate receiving a signal at a connection portion of said second PMOS transistor and said second NMOS transistor, and a third NMOS transistor connected to a voltage of said first voltage level and said third PMOS transistor and having a gate receiving said one complementary signal, said second selecting means includes inverting means for inverting said first control signal, and a fourth NMOS transistor connected between a voltage of said third voltage level and a connection portion of said third PMOS transistor and said third NMOS transistor and having a gate receiving an output signal of said inverting means.

10. The semiconductor device as recited in claim 1, further comprising:

first and second storage means for storing information;

amplifying means for amplifying an information signal output from said first or second storage means;

first connecting means for connecting said first storage means and said amplifying means when a voltage level of said third control signal is said third voltage level, and for disconnecting said first storage means and said amplifying means when the voltage level of said third control signal is said first voltage level, and second connecting means for connecting said second storage means and said amplifying means when the voltage level of said third control signal is said third voltage level, and disconnecting said second storage means and said amplifying means when the voltage level of said third control signal is said first voltage level, said control signal output means outputs two first control signals corresponding to said first and second connecting means, and turns on one of said first and second connecting means when said semiconductor device is in an operative state.

11. The semiconductor device as recited in claim 10, wherein said output means includes first output means responsive to a define signal defining an operative state of said semiconductor device for providing said first control signal, delay means for delaying said define signal and providing a delay signal, second output means responsive to a select signal selecting said storage means for providing an instruction signal instructing selection or non-selection for each storage means when said delay signal is in an active state, and third output means responsive to said instruction signal for providing said second control signal.

12. The semiconductor device as recited in claim 11, wherein said semiconductor device is a dynamic random access memory, said define signal is a row address strobe signal, and said select signal is a row address signal.

13. The semiconductor device as recited in claim 11, wherein said semiconductor device is a dynamic random access memory, said define signal is an externally applied define signal, said first output means further includes self-refresh operation detecting means for detecting self-refresh operation according to said define signal, and clock signal generating means responsive to a self-refresh operation sense signal provided from said self-refresh operation detecting means for providing a clock signal of a predetermined cycle.

14. The semiconductor device as recited in claim 13, wherein said define signal is an externally applied row address strobe signal and column address strobe signal, said self-refresh operation detecting means detects self-refresh operation in response to a row address strobe signal attaining an active state after said column address strobe signal attaining an active state.

15. The semiconductor device as recited in claim 1, further comprising a memory cell array including a plurality of memory cells disposed in row and column directions, a plurality of bit lines each connected to a corresponding one of said memory cells, and a plurality of word lines each connected to a corresponding one of said memory cells, wherein said control signal output means includes means for providing said third control signal as a control signal for activating said word line.

16. A semiconductor device, comprising:

first and second storage means for storing information;

amplifying means for amplifying an information signal output from said first or second storage means;

connecting means responsive to a control signal for selectively connecting said amplifying means and said first or second storage means; and control signal output means for pulling up said control signal from a first voltage level to a boosted second voltage level, wherein said control signal is pulled up from said first voltage level to a third voltage level which is intermediate between said first voltage level and said second voltage level, and then pulled up to said second voltage level from said third voltage level.

* * * * *